United States Patent
Ota et al.

(10) Patent No.: US 9,559,274 B2
(45) Date of Patent: *Jan. 31, 2017

(54) LIGHT EMITTING DEVICE AND RESIN COMPOSITION

(71) Applicant: NICHIA CORPORATION, Anan-shi, Tokushima (JP)

(72) Inventors: Akihiro Ota, Anan (JP); Seitaro Akagawa, Komatsushima (JP); Hirofumi Ichikawa, Tokushima (JP); Yasunori Shimizu, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/132,886

(22) Filed: Apr. 19, 2016

(65) Prior Publication Data

US 2016/0233396 A1 Aug. 11, 2016

Related U.S. Application Data

(63) Continuation-in-part of application No. 14/600,372, filed on Jan. 20, 2015, now Pat. No. 9,397,276.

(30) Foreign Application Priority Data

Oct. 17, 2014 (JP) ................................ 2014-213204
Jan. 16, 2015 (JP) ................................ 2015-006707

(51) Int. Cl.
*H01L 23/29* (2006.01)
*H01L 21/00* (2006.01)
(Continued)

(52) U.S. Cl.
CPC ................ *H01L 33/56* (2013.01); *C08K 3/22* (2013.01); *C08K 3/34* (2013.01); *C08K 3/36* (2013.01);
(Continued)

(58) Field of Classification Search
CPC ...................................................... H01L 33/56
(Continued)

(56) References Cited

U.S. PATENT DOCUMENTS 8,057,706 B1 11/2011 Setlur et al.
8,921,827 B2 12/2014 Pickett et al.
(Continued)

FOREIGN PATENT DOCUMENTS

JP 2008-274254 A 11/2008
JP 2010-004034 A 1/2010
(Continued)

OTHER PUBLICATIONS

Notification of Reasons for Rejection for Japanese Patent Application No. 2015-006707 mailed Apr. 26, 2016.
(Continued)

*Primary Examiner* — Calvin Lee
(74) *Attorney, Agent, or Firm* — Foley & Lardner LLP

(57) ABSTRACT

Provided a light emitting device comprising: a package; a light emitting element disposed in the package; an encapsulation member that covers the light emitting element, the encapsulation member being formed from a resin composition that contains a fluorescent material, a resin, and nanoparticles selected from at least one of the group consisting of aluminum oxide nanoparticles, titanium oxide nanoparticles, zinc oxide nanoparticles, zirconium oxide nanoparticles, and silicon oxide nanoparticles, wherein when the resin composition includes silicon oxide nanoparticles, the content of the silicon oxide nanoparticles is 0.02 to 5 mass parts relative to 100 mass parts of the resin; and wherein the fluorescent material is a red-light emitting fluorescent material including a fluoride material having a chemical composition that includes tetravalent manganese, at least one selected from the group consisting of alkali metal elements and $NH_4^+$, and
(Continued)

at least one selected from the group consisting of elements from Group 4 of the periodic table and elements from Group 14 of the periodic table.

21 Claims, 4 Drawing Sheets

(51) Int. Cl.
| | |
|---|---|
| *H01L 33/56* | (2010.01) |
| *C09K 11/61* | (2006.01) |
| *C09K 11/77* | (2006.01) |
| *C09K 11/02* | (2006.01) |
| *C08K 3/34* | (2006.01) |
| *C08K 3/36* | (2006.01) |
| *C08K 3/22* | (2006.01) |
| *H01L 33/50* | (2010.01) |
| *H01L 33/62* | (2010.01) |
| *H01L 33/54* | (2010.01) |
| *H01L 33/48* | (2010.01) |

(52) U.S. Cl.
CPC .......... *C09K 11/025* (2013.01); *C09K 11/617* (2013.01); *C09K 11/7734* (2013.01); *H01L 33/502* (2013.01); *H01L 33/507* (2013.01); *H01L 33/54* (2013.01); *H01L 33/62* (2013.01); *C08K 2003/2227* (2013.01); *C08K 2003/2237* (2013.01); *C08K 2003/2244* (2013.01); *C08K 2003/2296* (2013.01); *H01L 33/486* (2013.01); *H01L 33/504* (2013.01); *H01L 2933/0091* (2013.01)

(58) Field of Classification Search
USPC .................. 257/787–795; 438/112, 126, 127
See application file for complete search history.

(56) References Cited

U.S. PATENT DOCUMENTS

| | | | |
|---|---|---|---|
| 9,397,276 B2* | 7/2016 | Ota | .................. H01L 33/56 257/791 |
| 2010/0090585 A1 | 4/2010 | Seto et al. | |
| 2010/0187962 A1 | 7/2010 | Shin et al. | |
| 2011/0147778 A1 | 6/2011 | Ichikawa | |
| 2013/0264937 A1 | 10/2013 | Sakuta et al. | |
| 2015/0380613 A1 | 12/2015 | Hiramatsu et al. | |

FOREIGN PATENT DOCUMENTS

| | | |
|---|---|---|
| JP | 2011-012091 A | 1/2011 |
| JP | 2011-129661 A | 6/2011 |
| JP | 2012-104814 A | 5/2012 |
| JP | 2012-241059 A | 12/2012 |
| JP | 2013-533363 A | 8/2013 |
| JP | 2014-130903 A | 7/2014 |
| JP | 2014-177586 A | 9/2014 |
| JP | 2014-179565 A | 9/2014 |

OTHER PUBLICATIONS

Notice of Allowance for U.S. Appl. No. 14/600,372 mailed Mar. 21, 2016.

* cited by examiner

LIGHT EMITTING DEVICE AND RESIN COMPOSITION

CROSS-REFERENCE TO RELATED APPLICATIONS

This application is a continuation-in-part application of U.S. patent application Ser. No. 14/600,372 filed Jan. 20, 2015, now U.S. Pat. No. 9,397,276, issued Jul. 19, 2016, and claims priority under 35 USC 119 from Japanese patent Application No. 2014-213204, filed Oct. 17, 2014 and Japanese patent Application No. 2015-6707, filed Jan. 16, 2015, the entire disclosures of which are incorporated herein by reference.

BACKGROUND OF THE INVENTION

Field of the Invention

This disclosure relates to a light emitting device and a resin composition.

Description of the Related Art

A light emitting diode (LED) is a semiconductor light emitting element produced from a metal compound such as gallium nitride (GaN). Various types of light emitting devices that emit light of, e.g., white color, incandescent bulb color, or orange color have been developed using such a semiconductor light emitting element in combination with a fluorescent material. Such light emitting devices are able to emit, e.g., white light by the light color mixture principle. Well known systems that emit white light include systems using a light emitting element that emits ultraviolet light and three types of fluorescent materials that emit red (R), green (G), and blue (B) light, and systems using a light emitting element that emits a blue light and a fluorescent material that emits, e.g., a yellow light. Light emitting devices that employ systems using a light emitting element that emits a blue light and a fluorescent material that emits, e.g., a yellow light are demanded in a wide variety of fields, including general lighting, car lights, displays, and backlights for liquid crystals. Of these, fluorescent materials used in light emitting devices for liquid crystal backlights are desired to have both superior light emission efficiency and superior color purity for reproducing colors over a wide range of the chromaticity coordinates. Fluorescent materials used in light emitting devices for liquid crystal backlights are particularly desired to be advantageously used in combination with color filters and to have an emission peak with a narrow half bandwidth.

Red-light emitting fluorescent materials that exhibit an emission peak with a narrow half bandwidth and having an excitation band in the blue region, include, for example, fluoride fluorescent materials having compositions such as $K_2AlF_5:Mn^{4+}$, $K_3AlF_6:Mn^{4+}$, $K_3GaF_6:Mn^{4+}$, $Zn_2AlF_7:Mn^{4+}$, $KIn_2F_7:Mn^{4+}$, $K_2SiF_6:Mn^{4+}$, $K_2TiF_6:Mn^{4+}$, $K_3ZrF_7:Mn^{4+}$, $Ba_{0.65}Zr_{0.35}F_{2.70}:Mn^{4+}$, $BaTiF_6:Mn^{4+}$, $K_2SnF_6:Mn^{4+}$, $Na_2TiF_6:Mn^{4+}$, $Na_2ZrF_6:Mn^{4+}$, $KRbTiF_6:Mn^{4+}$, or $K_2Si_{0.5}Ge_{0.5}F_6:Mn^{4+}$ (see, e.g., Japanese Patent Application prior-to-examination Publication (kohyo) No. 2009-528429).

To protect the light emitting element and other components of a light emitting device, the light emitting element as well as wires and the other cables are encapsulated within an encapsulation material that contains fluorescent material particles.

SUMMARY OF THE INVENTION

A light emitting device includes a package; a light emitting element disposed in the package; an encapsulation member that covers the light emitting element and that is a cured product of a resin composition containing a fluorescent material, a resin, and nanoparticles selected from at least one of the group consisting of aluminum oxide nanoparticles, titanium oxide nanoparticles, zinc oxide nanoparticles, zirconium oxide nanoparticles, and silicon oxide nanoparticles, wherein when the resin composition includes silicon oxide nanoparticles, the content of the silicon oxide nanoparticles is 0.02 to 5 mass parts relative to 100 mass parts of the resin; and; and wherein the fluorescent material is a red-light emitting fluorescent material including fluoride material having a chemical composition that includes tetravalent manganese, at least one selected from the group consisting of alkali metal elements and $NH_4^+$, and at least one selected from the group consisting of elements from Group 4 of the periodic table and elements from Group 14 of the periodic table.

The light emitting device reduces losses in emission output and generation of chromaticity change, and has superior durability and reliability.

Figure 1:
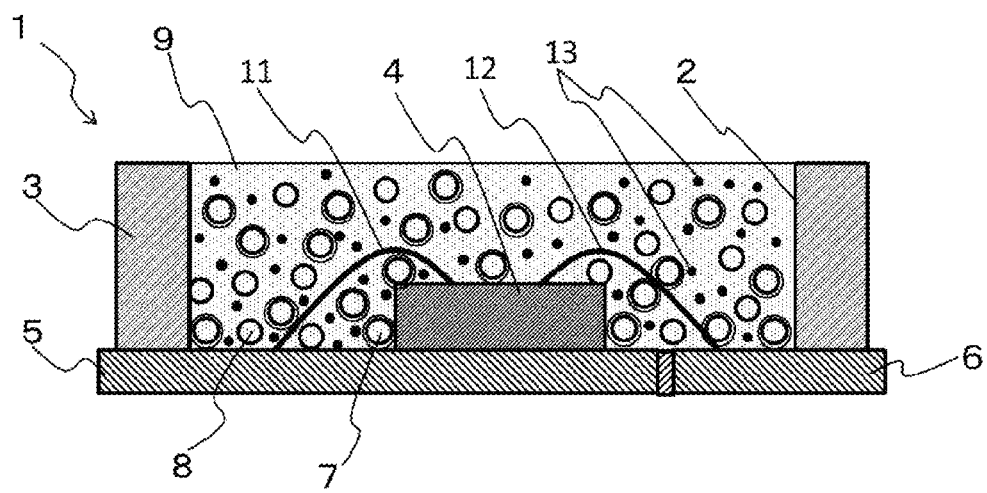
FIG. 1 is a schematic sectional view of a light emitting device according to one example embodiment.

DETAILED DESCRIPTION OF THE INVENTION $Mn^{4+}$-activated red-light emitting fluoride fluorescent materials that have an emission peak with a narrow half bandwidth and that are suitable for use in backlights are desired to be widely put into practice.

In a conventional $Mn^{4+}$-activated fluoride fluorescent material, however, the $Mn^{4+}$ that constitutes the fluoride fluorescent material particle reacts with water in the air on its particle surface and generate manganese dioxide, which colors the particle surface, resulting in chromaticity change or losses in emission output over time. Thus, there is a concern that light emitting devices using a conventional $Mn^{4+}$-activated red-light (emitting) fluorescent material may not be suitable for use in liquid crystal backlights, in which reliability is highly important.

To solve this problem, one mode of the present disclosure aims to provide a light emitting device that reduces losses in emission output and generation of chromaticity change, and that has superior durability and improved reliability, and a resin composition used therefor.

Specific means for solving the problem is as follows, and the present disclosure includes the following modes.

A first mode of the present disclosure is a light emitting device that includes a package; a light emitting element disposed in the package; an encapsulation member that covers the light emitting element and that is a cured product of a resin composition containing a fluorescent material, a resin, and nanoparticles selected from at least one of the group consisting of aluminum oxide nanoparticles, titanium oxide nanoparticles, zinc oxide nanoparticles, zirconium oxide nanoparticles, and silicon oxide nanoparticles, wherein when the resin composition includes silicon oxide nanoparticles, the content of the silicon oxide nanoparticles is 0.02 to 5 mass parts relative to 100 mass parts of the resin; and wherein the fluorescent material is a red-light emitting fluorescent material including fluoride material having a chemical composition that includes tetravalent manganese, at least one selected from the group consisting of alkali metal elements and $NH_4^+$, and at least one selected from the group consisting of elements from Group 4 of the periodic table and elements from Group 14 of the periodic table.

A second mode of the present disclosure is a resin composition containing a fluorescent material, a resin, and nanoparticles selected from at least one of the group consisting of aluminum oxide nanoparticles, titanium oxide nanoparticles, zinc oxide nanoparticles, zirconium oxide nanoparticles, and silicon oxide nanoparticles, wherein when the resin composition includes silicon oxide nanoparticles, the content of the silicon oxide nanoparticles is 0.02 to 5 mass parts relative to 100 mass parts of the resin; and the fluorescent material is a red-light emitting fluorescent material including fluoride material having a chemical composition that includes tetravalent manganese, at least one selected from the group consisting of alkali metal elements and $NH_4^+$, and at least one selected from the group consisting of elements from Group 4 of the periodic table and elements from Group 14 of the periodic table.

According to one mode of the present disclosure, a light emitting device that reduces losses in emission output and that has superior durability and improved reliability, and a resin composition used therefor are provided.

A light emitting device and a resin composition according to one mode of the present disclosure will be explained below. The described embodiments, however, are mere examples of the light emitting device, the resin composition, and the method for manufacturing them for embodying the technical concept of the present invention, and the present invention is by no means limited to the light emitting device, the resin composition, and the method for manufacturing them as described.

The relationship between color names and chromaticity coordinates and the relationship between the wavelength range of light and the color name of monochromatic light, for example, are in accordance with JIS Z8110. Specifically, the range of 380 nm to 410 nm corresponds to violet color, the range of 410 nm to 455 nm corresponds to bluish violet color, the range of 455 nm to 485 nm corresponds to blue, the range of 485 nm to 495 nm corresponds to bluish green, the range of 495 nm to 548 nm corresponds to green, the range of 548 nm to 573 nm corresponds to yellowish green, the range of 573 nm to 584 nm corresponds to yellow, the range of 584 nm to 610 nm corresponds to yellowish red, and the range of 610 nm to 780 nm corresponds to red.

In the present specification, the term "step" means not only an independent step but also a step which cannot be clearly distinguished from other steps but can achieve the desired object. Ranges of numerical values include the numerical values that appear before and after "to" as the minimum and the maximum values of the range. For the amount of each component contained in the encapsulation material, when a plurality of compounds corresponding to the component exist, the amount of the component means the total amount of the compounds present in the encapsulation material unless otherwise specified.

Light Emitting Device

FIG. 1 is a sectional view illustrating a schematic structure of a light emitting device 1 according to a first embodiment.

A light emitting device 1 includes a package 3, a light emitting element 4 disposed in the package 3, and an encapsulation member 9 that covers the light emitting element 4. The package 3 has side walls that define a recess 2. The package 3 includes a first lead 5 and a second lead 6 that together form the bottom of the package. The encapsulation member 9 is a cured product of a resin composition that includes a red-light fluorescent material 7 and a fluorescent material 8 that emits light other than red (hereinafter "a non-red fluorescent material 8"), a resin (not shown), and at least one nanoparticle 13 selected from the group consisting of an aluminum oxide nanoparticle, a titanium oxide nanoparticle, a zinc oxide nanoparticle, a zirconium oxide nanoparticle, and a silicon oxide nanoparticle, and when the nanoparticle 13 contains a silicon oxide nanoparticle, the content of the silicon oxide nanoparticle is 0.02 to 5 mass parts relative to 100 mass parts of the resin.

FIG. 1 is not drawn to scale, but merely schematically shows the particles of a red-light fluorescent material 7, the particles of a non-red fluorescent material 8, and nanoparticles 13 that are contained in the encapsulation member 9.

The red-light fluorescent material 7 is a red-light emitting fluorescent material including a fluoride material having a chemical composition that includes tetravalent manganese, at least one selected from the group consisting of alkali metal elements and $NH_4^+$, and at least one selected from the group consisting of elements from Group 4 of the periodic table and elements from Group 14 of the periodic table. The fluorescent material may have a chemical composition represented by the formula (I):

$$A_2[M_{1-x}Mn^{4+}_xF_6] \qquad (I)$$

wherein A is at least one selected from the group consisting of alkali metal elements and $NH_4^+$; M is at least one selected from the group consisting of elements from Group 4 of the periodic table and elements from Group 14 of the periodic table; and x satisfies 0<x<0.2. The fluorescent material may have a surface region with a lower $Mn^{4+}$ concentration than the inner region of the fluorescent material. The non-red fluorescent material 8 is a fluorescent material that emits light other than red, specifically, light from green to yellow.

The light emitting element 4 is arranged on the first lead 5 that is disposed in the bottom portion of the recess 2 of the package 3. The light emitting element 4 is connected to positive and negative electrodes (not shown), and to the first lead 5 and the second lead 6 made of metal, using wires 11 and 12, respectively. The first lead 5 and the second lead 6 form the bottom of the recess 2 of the package 3.

Package

Although the material for the package having side walls, which define a recess, is not particularly limited, an electrically insulating material with superior light resistance and heat resistance is preferably used. Examples of such materials for the package include resins and ceramics. The first and second leads form the bottom of the recess of the package, and are substantially plane-like members on which a light emitting element or the like can be placed.

Examples of ceramics that may be used as a material for the package include alumina, aluminum nitride, mullite, silicon carbide, and silicon nitride. Calcined ceramic green sheets, which are prepared by mixing a ceramic powder with a resin and molding the resultant mixture into sheets, followed by calcination of the laminated sheets, may also be used.

Examples of resins that may be used as a material for the package include epoxy resin and polyamide resin. As a package made of epoxy resin, those prepared by, for example, laminating a copper plate to an epoxy resin that contains glass cloth or to a prepreg that is obtained by semi-curing such an epoxy resin, may be used.

Light Emitting Element

A light emitting element that emits visible light in a short wavelength region may be used as the light emitting element. A light emitting element that emits, for example, blue to green light, may include, for example, a nitride semiconductor ($In_X Al_Y Ga_{1-X-Y} N$, $0 \leq X$, $0 \leq Y$, $X+Y \leq 1$). This enables efficient excitation of a fluorescent material and effective use of visible light.

The light source (hereinafter also referred to as "excitation light source") of the light emitting element preferably emits light in a wavelength range of 380 nm to 573 nm, which is in the short wavelength region of visible light. The light source preferably emits light from bluish violet to blue, and has an emission peak wavelength (maximum emission wavelength) in the wavelength range of 420 to 485 nm, and, more preferably, in the wavelength range of 440 to 480 nm. By using such an excitation light source, a light emitting device having a high light emission intensity can be provided.

Using a semiconductor light emitting element as the excitation light source provides a highly efficient light emitting device that has high output linearity to the input and is resistant and stable to mechanical impact.

First Lead and Second Lead

The package includes a first lead and a second lead that are arranged in the bottom of the recess, and the first lead and the second lead form the bottom of the recess of the package. The first lead and the second lead together may be referred to as a conductive member. The first and second leads may be composed only of a conductive base material, or may include a base material and a reflection film, or may be composed only of a conductive reflection film. Further, the first and second leads may be composed of a base material, a reflection film, and another member that is interposed between the base material and the reflection film. When the conductive member includes a base material and a reflection film, the reflection film is disposed at least on a side on which a light emitting element is disposed.

Base Material for the First Lead and Second Leads

When the base material for the first and second leads is conductive, the base material may be, for example, copper or an alloy of copper and iron.

Reflection Film of the First and Second Leads

For the reflection film, for example, a material containing at least silver or aluminum may be used, and, in particular, a material containing highly reflective silver is preferably used. A material containing a metal such as copper, aluminum, gold, white silver, tungsten, iron, and nickel, or an alloy such as an iron-nickel alloy, phosphorus blue copper, and an iron-copper alloy, in addition to silver, may be used to form the reflection film".

Insulating Member

The light emitting element, the first lead, the second lead, and the wires are preferably covered with an insulating member. The insulating member is preferably provided on the light emitting element, the first lead, the second lead, and the wires in a continuous manner. As used herein, "provided . . . in a continuous manner" indicates a state where the insulating member is provided in the form of a layer (a film) on the subject consisting of the light emitting element, the first lead, the second lead, and the wires, or a state where the insulating member is provided in the form of a powder or needles on the light emitting element, the first lead, the second lead, and the wires substantially entirely while leaving partial voids therein. The insulating member protects the metals that constitute the light emitting element, the first lead, the second lead, and the wires, in particular, silver that may be used to form the first and second leads, from gas, water, and fluorine (F) in the fluorescent material, for example, which may modify the metals. In a case where fluorine contained in the fluorescent material reacts with silver that is contained, for example, in the conductive member, the reaction would produce silver fluoride. The silver fluoride would absorb the light emitted by the light emitting element, which may reduce the emission output. The insulating member can efficiently prevents or reduces the deterioration of silver that is contained in the first and second leads, thereby enhancing the light output efficiency. The insulating member also functions as a protecting film and eliminates migration of silver that is contained in the first and second leads, for example, by blocking moisture or the like. Thus, the reaction of the migrated silver with fluorine (F), which is contained in the red-light fluorescent material, can be prevented or reduced.

Insulating Member

The material for the insulating member is preferably translucent, and preferably contains an inorganic compound. Specific examples of the material for the insulating member include oxides, such as $SiO_2$, $Al_2O_3$, $TiO_2$, $ZrO_2$, $ZnO_2$, $Nb_2O_3$, MgO, SrO, $In_2O_3$, $TaO_2$, HfO, SeO, and $Y_2O_3$; nitrides, such as SiN, AlN, and AlON; and fluorides, such as $MgF_2$. These may be used alone or in combination. Alternatively, two or more insulating members that contain at least the above-described materials may be layered.

The insulating member preferably has a thickness that would not cause loss of light due to multiple reflection at various interfaces between the conductive member, the insulating member, and the encapsulation member. The insulating member, in contrast, needs to have a thickness that enables it to block, for example, gas, water, and fluorine (F), which is contained in the fluorescent material, from reacting with the conductive member. The thickness of the insulating member slightly varies depending on, for example, the materials of the members that constitute the light emitting device. The insulating member has a thickness of preferably about 1 nm to 100 nm, more preferably 1 nm to 50 nm, still more preferably 2 nm to 25 nm, and particularly preferably 3 nm to 10 nm.

The insulating member is preferably formed as a film (layer) that is made of an inorganic compound on the conductive member, the wires and the light emitting element, by sputtering or deposition. The insulating member is more preferably formed as a film (layer) by Atomic Layer Deposition. Atomic Layer Deposition is a method of forming layers of reactive components, one atomic layer at a time. Atomic Layer Deposition can form an insulating member (film) as a high-quality protecting film having a uniform film thickness and a uniform film quality with reactive components being uniformly dispersed on the subject regardless of obstacles or irregularities, unlike a conventional sputtering or deposition methods. An insulating member (film) formed by Atomic Layer Deposition has a thin film, which can reduce absorption of light. With such an insulating member, a light emitting device having a higher initial light output can be provided.

Next, an example of forming an insulating member (film) of aluminum oxide ($Al_2O_3$) by Atomic Layer Deposition will be explained.

First, trimethylaluminum (hereinafter also referred to as "TMA") gas is introduced into a chamber containing the subject, specifically, the conductive member, the wires and the light emitting element, and the TMA gas reacts with the OH groups on the surfaces of the subject (first reaction). Excess gas is then evacuated. Next, $H_2O$ gas is introduced into the subject, causing $H_2O$ to react with TMA that reacted with OH-group in the first reaction (second reaction). Excess gas is then evacuated. This single cycle consisting of the first reaction, evacuation, the second reaction, and evacuation, is repeated multiple times until an aluminum oxide ($Al_2O_3$) film having the desired thickness is formed on the surfaces of the conductive member, the wires and the light emitting element.

Encapsulation Member

The encapsulation member is a cured product of a resin composition that includes a red light fluorescent material, a fluorescent material that emits light other than red, a resin, and nanoparticles selected from at least one of the group consisting of aluminum oxide nanoparticles, titanium oxide nanoparticles, zinc oxide nanoparticles, zirconium oxide nanoparticles, and silicon oxide nanoparticles, wherein when the resin composition includes silicon oxide nanoparticles, the content of the silicon oxide nanoparticles is 0.02 to 5 mass parts relative to 100 mass parts of the resin.

Encapsulation Material (Resin Composition)

The encapsulation member is a resin composition that includes a fluorescent material, a resin, and nanoparticles selected from at least one of the group consisting of aluminum oxide nanoparticles, titanium oxide nanoparticles, zinc oxide nanoparticles, zirconium oxide nanoparticles, and silicon oxide nanoparticles, wherein when the resin composition includes silicon oxide nanoparticles, the content of the silicon oxide nanoparticles is 0.02 to 5 mass parts relative to 100 mass parts of the resin.

Resin

The resin contained in the resin composition used to form the encapsulation member is preferably translucent so that it allows light from the light emitting element to transmit through it. Specific examples of suitable resins include a silicone resin, a modified silicone resin, an epoxy resin, a modified epoxy resin, and an acrylic resin. The resin is preferably at least one resin selected from the group consisting of a silicone resin, a modified silicone resin, an epoxy resin, a modified epoxy resin, and an acrylic resin. The resin may also be a silicone resin, an epoxy resin, an urea resin, a fluorine resin, or a combination of these resins. Of these, a modified silicone resin is preferable, and a phenyl silicone resin prepared by introducing a phenyl group into a side chain of polysiloxane is more preferable. The resin preferably contains a phenyl silicone resin.

The content of the resin in the resin composition is preferably 5 to 95 mass % in 100 mass % of the resin composition, more preferably 35 to 85 mass %, still more preferably 40 to 80 mass %, and particularly preferably 45 to 75 mass %. With the resin content being 5 to 95 mass % in 100 mass % of the resin composition, the resin composition after curing can safely protect the members, including a light emitting element, that are arranged in the recess. With the content of the resin in the resin composition within the above range, the encapsulation member can contain a sufficient amount of fluorescent particles for covering the light emitting element.

Nanoparticles

The resin composition forming the encapsulation member contains nanoparticles selected from at least one of the group consisting of aluminum oxide nanoparticles, titanium oxide nanoparticles, zinc oxide nanoparticles, zirconium oxide nanoparticles, and silicon oxide nanoparticles.

The resin composition may contain nanoparticles selected at least one of the group consisting of aluminum oxide nanoparticles, titanium oxide nanoparticles, zinc oxide nanoparticles, zirconium oxide nanoparticles, and silicon oxide nanoparticles, or a combination of nanoparticles of at least two selected from the group. The resin composition may also contain either zirconium oxide nanoparticles or silicon oxide nanoparticles, or both of them. When the resin composition contains two or more types of nanoparticles, their ratio is not particularly limited and may be appropriately selected depending on, for example, the purpose.

Due to the presence of the nanoparticles, fluorescent particles are well dispersed in the encapsulation member formed from the resin composition containing nanoparticles, and the reaction between the fluorescent particles and water is prevented or reduced. With such an encapsulation member, a light emitting device that demonstrates superior durability in a long-term reliability test can be provided.

In the encapsulation member formed from the resin composition, nanoparticles are preferably substantially uniformly dispersed. Here, the state where nanoparticles are substantially uniformly dispersed in the encapsulation member indicates that in any cross-section of the cured encapsulation member observed, the nanoparticles that exist therein have a cross-sectional area, and the difference between the number of the nanoparticles that exist within a given area of a particular cross section and the average number of such nanoparticles is limited to a predetermined range, and that nanoparticles are not unevenly or locally distributed in any cross-section. For example, if nanoparticles are not unevenly distributed or locally distributed in multiple locations, under electron microscopy observation at any magnification within any visual field range, in any cross section of the cured encapsulation member, then the nanoparticles can be said to be substantially uniformly dispersed.

Zirconium oxide nanoparticles (also called "zirconia nanoparticles") have a number average primary particle size of preferably 1 nm to 100 nm, more preferably 2 nm to 80 nm, still more preferably 2 nm to 60 nm, and particularly preferably 2 nm to 50 nm as determined by transmission electron microscopy (TEM).

When the resin composition contains zirconium oxide nanoparticles, the content of the zirconium oxide nanoparticles is preferably 0.1 to 30 mass parts, more preferably 0.5 to 30 mass parts, still more preferably 0.8 to 28 mass parts, particularly preferably 1 to 27 mass parts, and most preferably 3 to 25 mass parts relative to 100 mass parts of the resin in the resin composition.

The resin composition that constitutes the encapsulation member may contain zirconium oxide nanoparticles having a relatively small primary particle size. This enables the resin composition to maintain the same color tone with less fluorescent material in the resin composition than conventional resin compositions because the zirconium oxide nanoparticles dispersed in the resin composition cause Rayleigh scattering of light, thereby enhancing the scattering effect of light from the light emitting element. Additionally, with less fluorescent material in the resin composition, the reaction between the fluorescent material with water can further be prevented. By using a resin composition containing zirconium oxide nanoparticles, a light emitting device that demonstrates superior durability in a long-term reliability test can be provided.

Silicon Oxide Nanoparticles

Silicon oxide nanoparticles (also referred to as "silica nanoparticles") have a number average primary particle size of preferably 1 nm to 100 nm, more preferably 5 nm to 90 nm, still more preferably 8 nm to 80 nm, and particularly preferably 10 nm to 70 nm as determined by TEM.

When the resin composition contains silicon oxide nanoparticles, the content of the silicon oxide nanoparticles is preferably 0.02 to 5 mass parts, preferably 0.05 to 3 mass parts, more preferably 0.1 to 2 mass parts, still more preferably 0.2 to 1 mass parts, and particularly preferably 0.3 to 0.8 mass parts relative to 100 mass parts of the resin in the resin composition.

By containing a specific amount of silicon oxide nanoparticles in the resin composition, the resin composition that constitutes the encapsulation member has a high viscosity. This helps the fluorescent particles to be more dispersible, resulting in the fluorescent particles being uniformly dispersed in the cured resin composition, preventing the fluorescent particles from localizing in the surface area of the cured resin composition, thereby further preventing the fluorescent particles from reacting with water. In this manner, by using a resin composition containing silicon oxide nanoparticles, a light emitting device that proves superior durability in a long-term reliability test can be provided.

Other Nanoparticles

The resin composition may contain other nanoparticles in addition to zirconium oxide nanoparticles and silicon oxide nanoparticles. Examples of such other nanoparticles include aluminum oxide nanoparticles, titanium oxide nanoparticles, and zinc oxide nanoparticles. These nanoparticles each have a number average primary particle size of preferably 1 nm to 100 nm, more preferably 2 nm to 80 nm, still more preferably 2 nm to 60 nm, and particularly preferably 2 nm to 50 nm as determined by TEM.

The content of the other nanoparticles is preferably 0.1 to 30 mass parts, more preferably 0.5 to 30 mass parts, still more preferably 0.8 to 28 mass parts, particularly preferably 1 to 27 mass parts, and most preferably 3 to 25 mass parts relative to 100 mass parts of the resin in the resin composition.

Filler

The resin composition that constitutes the encapsulation member may contain a filler besides nanoparticles. The filler contained in the resin composition that constitutes the encapsulation member has a volume average particle size of its secondary particle of preferably above 1000 nm. The filler has a volume average particle size (median size: d50) of its secondary particle of preferably 5 μm to 100 μm, more preferably 7 μm to 90 μm, still more preferably 8 μm to 80 μm, particularly preferably 10 μm to 60 μm, and most preferably 10 μm to 50 μm as determined by a particle size analyzer based on a laser differential scattering method.

The material of the filler may be at least one inorganic material selected from the group consisting of inorganic oxides, metal nitrides, metal carbides, carbon compounds and sulfides. Examples of the inorganic oxides include titanium oxide, tantalum oxide, niobium oxide, tungsten oxide, zirconium oxide (zirconia), zinc oxide, indium oxide, tin oxide, hafnium oxide, yttrium oxide, silicon oxide (silica), and aluminum oxide (alumina). A complex inorganic oxide thereof may also be used. An example of the metal nitride is silicon nitride. An example of the metal carbide is silicon carbide. Examples of the carbon compound include translucent inorganic materials such as diamond and diamond-like-carbon, although they are a single body of carbon. Examples of the sulfides include copper sulfide and tin sulfide. Examples of the other materials for the filler include barium titanate, calcium phosphate, calcium carbonate, white carbon, talc, magnesium carbonate, boron nitride, and fiberglass. Of these, the material for the filler is preferably alumina, silica, or zirconia. In particular, the material of the filler is preferably silica. The shape of the filler may be spherical, flaky, or multiple forms produced by pulverizing agglomerates, and a spherical shape is preferable.

When the resin composition contains a filler, the content of the filler in the resin composition is preferably 0.1 to 50 mass parts, more preferably 0.2 to 45 mass parts, still more preferably 0.5 to 40 mass parts, and particularly preferably 1 to 35 mass parts relative to 100 mass parts of the resin.

With the content of the filler being 0.1 to 50 mass parts relative to 100 mass parts of the resin, the components of the resin composition have improved dispersibility, and thus, for example, when a red-light fluorescent material and a fluorescent material that emits light from green to yellow (hereinafter "green to yellow-light emitting fluorescent material") are contained, the particles of the red-light fluorescent material and the green to yellow-light emitting fluorescent material can be substantially uniformly dispersed in the encapsulation material. Here, the state where the fluorescent particles are substantially uniformly dispersed in the cured resin composition (encapsulation member) indicates that in any cross-section of the cured resin composition (encapsulation member) observed, the difference between the number of the fluorescent particles that exist in a given range and the average number of such fluorescent particles is limited to a predetermined range, and that the fluorescent particles are not locally distributed in the cross-section. For example, if the fluorescent particles are not unevenly or locally dispersed in multiple locations, under electron microscopy observation at any magnification within any visual field range, in any cross section of a cured resin composition (encapsulation member), then the fluorescent particles can be said to be substantially uniformly dispersed in the cured resin composition (encapsulation member).

The filler contained in the resin composition allows the fluorescent material particles to be substantially uniformly dispersed in the resin composition. The filler also allows approximately equal amounts of injection of the fluorescent material particles and the nanoparticles into the recess of each package when a resin composition, which constitutes the encapsulation member, is injected, thereby producing a light emitting device that has less variation in color tone among packages.

Red-Light Fluorescent Material

The fluorescent material includes a red-light emitting fluorescent material that is a fluoride material having a chemical composition that includes tetravalent manganese, at least one selected from the group consisting of alkali metal elements and $NH_4^+$, and at least one selected from the group consisting of elements from Group 4 of the periodic table and elements from Group 14 of the periodic table. The fluorescent material may have a chemical composition, for example, represented by the formula (I):

$$A_2[M_{1-x}Mn^{4+}{}_xF_6] \qquad (I)$$

wherein A is at least one selected from the group consisting of alkali metal elements and $NH_4^+$; M is at least one selected from the group consisting of elements from Group 4 of the periodic table and elements from Group 14 of the periodic table; and x satisfies 0<x<0.2.

The fluorescent material may be a particle that has a surface region with a lower $Mn^{4+}$ concentration than the inner region of the fluorescent material.

The red-light fluorescent material that has a surface region with a lower $Mn^{4+}$ concentration than the inner region of the fluorescent material, is more superior in moisture resistance and demonstrates improved durability in a long-term reliability test. This mechanism will be elaborated below.

In conventional red-light fluoride fluorescent particles that have a chemical composition represented by the formula (I), a $Mn^{4+}$ in the fluoride may react with water at the surface region of the particles to produce manganese dioxide, which discolors the particle surface, causing losses in the emission output. Thus, conventional red-light fluoride fluorescent materials have failed to achieve sufficient durability in a long-term reliability test, and have long believed not to be suitable for applications in which reliability is highly important.

In contrast, the red-light fluorescent material according to one mode of the present disclosure has a surface region with a lower $Mn^{4+}$ concentration than the inner region of the fluorescent material. Thus, the generation of manganese dioxide on the particle surface is reduced, thereby moderating the losses in emission output and the generation of chromaticity change over time. This enables to achieve long-term reliability of the product.

Although the particle size and particle size distribution of a red-light fluorescent material having a chemical composition represented by the formula (I) is not particularly limited, a single peak particle size distribution is preferable, and more preferably a single peak particle size distribution with a narrow distribution width, to achieve superior emission intensity and durability. The surface area and the bulk density of the red-light fluorescent material are not particularly limited.

The red-light fluorescent material is a $Mn^{4+}$-activated fluorescent material, and emits red-light by absorbing light in the short wavelength region of visible light. The excitation light, which is in the short wavelength region of visible light, is light preferably mainly in the blue region. The excitation light preferably has a main peak wavelength (emission peak wavelength) of the intensity spectra in the range of, specifically, 380 nm to 573 nm, more preferably 380 nm to 500 nm, still more preferably 380 nm to 485 nm, even more preferably 400 nm to 485 nm, and particularly preferably 440 nm to 480 nm.

The emission wavelength of the red-light fluorescent material is not particularly limited as long as it is red light and has a longer wavelength than the excitation light. The emission spectrum of the red-light fluorescent material preferably has a peak wavelength in the range of 610 nm to 650 nm. The half bandwidth of the emission spectrum is preferably small, and is specifically preferably 10 nm or less.

A in the formula (I) is at least one selected from the group consisting of alkali metal elements and $NH_4^+$ and may be at least one cation selected from the group consisting of potassium ($K^+$), lithium ($Li^+$), sodium ($Na^+$), rubidium ($Rb^+$), cesium ($Cs^+$), and ammonium ($NH_4^+$). When A includes potassium, the percentage of potassium in A is not particularly limited, and is preferably 50 mol % or more, and more preferably 80 mol % or more, for example.

M in the formula (I) is at least one element selected from the group consisting of elements from Group 4 of the periodic table and elements from Group 14 of the periodic table. To achieve superior light emitting properties, M is preferably at least one element selected from the group consisting of titanium (Ti), zirconium (Zr), hafnium (Hf), silicon (Si), germanium (Ge), and tin (Sn), and, more preferably, M includes silicon (Si) or both silicon (Si) and germanium (Ge), and more preferably silicon (Si), or both silicon (Si) and germanium (Ge).

When M includes silicon (Si) or both silicon (Si) and germanium (Ge), at least one of Si and Ge may be partially substituted by at least one element selected from the group consisting of elements from Group 4 of the periodic table, which includes Ti, Zr and Hf, and elements from Group 14 of the periodic table, which include C and Sn. In that case, the total percentage of Si and Ge in M is not particularly limited, and is preferably 50 mol % or more, and more preferably 80 mol % or more, for example.

The red-light fluorescent material may have an inner region, which is formed in the 1st step, and a surface region having a lower $Mn^{4+}$ concentration than the inner region of the fluorescent material. The surface region is formed in the 2nd step and the 3rd step as well as in the 2'nd step.

The surface region of the red-light fluorescent material may have a lower $Mn^{4+}$ concentration than the inner region of the fluorescent material. The surface region may be clearly separated from the inner region by the interface between them so that the two regions form a two-layered structure. Alternatively, the surface region may not be separated by a clear interface from the inner region, with a gradient in $Mn^{4+}$ concentration that gradually decreases from the inner side toward the outer side of the surface region.

The red-light fluorescent particles that are produced from the manufacturing process to be described later exhibit, as particles as a whole, one of the features of the $Mn^{4+}$ activated red-light fluorescent material of the present disclosure that the color reproduction range (color gamut) of the image display apparatus is broader than that of conventional red-light fluorescent materials. While maintaining this feature, even when the surface of the red-light fluorescent material is deteriorated due to moisture, less manganese dioxide derived from a $Mn^{4+}$ is generated because there is no or little $Mn^{4+}$ in the surface region. This, in turn, reduces discoloration of the surface of the red-light fluorescent material and losses in the emission output.

The average value of the $Mn^{4+}$ concentration in the surface region of the red-light fluorescent material is preferably up to 30 mass %, more preferably up to 25 mass %, and still more preferably up to 20 mass % of the average value of the $Mn^{4+}$ concentration in the inner region. The $Mn^{4+}$ concentration in the surface region may be set to at least 0.5 mass % of that of the inner region. As stated above, as the $Mn^{4+}$ concentration becomes closer to zero, the moisture resistance improves. With the decrease in the $Mn^{4+}$ concentration in the surface region, however, the percentage of a portion that does not contribute to emitting light increases in the surface region of the fluoride fluorescent material particles. This is likely to cause reduction in the emission intensity.

The thickness of the surface region is preferably about 1/10 to 1/50 of the average particle size, although it varies depending on the particle size of the red-light fluorescent material. When the average particle size of the red-light fluorescent material is from 20 μm to 40 μm, the thickness of the surface region is up to 2 μm, and preferably up to 1 μm.

The red-light fluorescent particles are prepared such that when the particles are introduced into pure water with a volume of 1 to 5-times the mass of the red-light fluorescent particles, the amount of elution of the tetravalent manganese ion at 25° C. falls within the range of, for example, 0.05 ppm to 3 ppm. The amount of elution of the tetravalent manganese ion under these conditions is preferably from 0.1 ppm to 2.5 ppm, and still more preferably 0.2 ppm to 2.0 ppm. As the amount of elution of the tetravalent manganese ion decreases, the moisture resistance increases. However, as the percentage of the surface region with less $Mn^{4+}$ ions increases, the emission intensity is likely to decrease, as stated above. The amount of elution of manganese ion can be measured as follows: The red-light fluorescent particles are introduced into pure water with a volume of 1 to 5-times (preferably 3-times) the mass of the red-light fluorescent particles, and the mixture is stirred at 25° C. for 1 hour. To the mixture, a reducing agent is added to elute manganese ions in the mixture liquid. The eluted supernatant is collected and measured by quantitative analysis with ICP emission spectrometry.

Such a configuration of the red-light fluorescent particles reduces losses of the emission output caused by the coloring of the surface of the red-light fluorescent due to generation of manganese dioxide that is derived from the $Mn^{4+}$ ions of the fluorescent material, and achieves a red-light fluorescent material with high moisture resistance.

The moisture resistance of the red-light fluorescent material can be evaluated by color change in a pressure cooker test (PCT). Additionally, the moisture resistance can be evaluated, for example, by the maintenance percentage of light emission brightness after water resistance test, specifically, the percentage (%) of light emission brightness after water resistance test relative to light emission brightness before water resistance test. The maintenance percentage of light emission brightness after water resistance test is preferably 85% or more, and more preferably 90% or more.

Here, the water resistance test is carried out specifically by introducing red-light fluorescent material particles into water with a volume of 1 to 5-times (preferably 3-times) the mass of the red-light fluorescent material particles, and stirring the mixture at 25° C. for 1 hour.

Process for producing Red-light Fluorescent Material

The red-light fluorescent material that has a chemical composition represented by the formula (I) and has a surface region with a lower tetravalent manganese ion concentration than the inner region of the fluorescent material can be produced by the production process including, for example, a first step of producing the inner region (hereinafter also called "the core portion"), a second step of producing the surface region, and a third step.

First Step

The process for producing a red-light fluorescent material includes a first step of preparing a fluoride particle (core portion) that has a chemical composition represented by the formula (I). The preparation step may include a step of producing a fluoride particle that has a chemical composition represented by the formula (I).

A fluoride particle that has a chemical composition represented by the formula (I) can be produced by contacting a first complex ion that contains a tetravalent manganese ion; at least one cation selected from the group consisting of potassium ($K^+$), lithium ($Li^+$), sodium ($Na^+$), rubidium ($Rb^+$), cesium ($Cs^+$), and ammonium ($NH_4^+$); and a second complex ion containing at least one element selected from the group consisting of elements from Group 4 of the periodic table and elements from Group 14 of the periodic table in a liquid medium that contain hydrogen fluoride.

A fluoride particle that has a chemical composition represented by the formula (I) can be produced by, for example, a production process including a step of mixing a Solution a that contains at least a first complex ion containing a tetravalent manganese ion, a second complex ion containing a fluorine ion and at least one element selected from the group consisting of elements from Group 4 of the periodic table and elements from Group 14 of the periodic table, and hydrogen fluoride, with a Solution b that contains at least one cation selected from the group consisting of $K^+$, $Li^+$, $Na^+$, $Rb^+$, $Cs^+$ and $NH_4^+$ and hydrogen fluoride (hereinafter also referred to as "A first process for producing a fluoride").

Solution a

Solution a is a hydrofluoric acid solution containing a first complex ion that contains a tetravalent manganese ion, and a second complex ion that contains at least one element selected from the group consisting of elements from Group 4 of the periodic table and elements from Group 14 of the periodic table and a fluorine ion.

The manganese source that constitutes a first complex ion containing a tetravalent manganese is not particularly limited as long as it is a compound containing manganese. Specific examples of the manganese source capable of forming Solution a include $K_2MnF_6$, $KMnO_4$, and $K_2MnCl_6$. Of these, $K_2MnF_6$ is preferable, mainly because it can stably present in hydrofluoric acid in the form of $MnF_6$ complex ions while maintaining oxidation number (tetravalent) to be activated. The manganese sources containing at least one cation selected from the group consisting of potassium ($K^+$), lithium ($Li^+$), sodium ($Na^+$), rubidium ($Rb^+$), cesium ($Cs^+$), and ammonium ($NH_4^+$) can also serve as the cation source of Solution b. The manganese sources for the first complex ions may be used alone or in combination.

The concentration of the first complex ion in Solution a is not particularly limited. The lower limit of the concentration of the first complex ion in Solution a is usually 0.01 mass % or more, preferably 0.03 mass % or more, and more preferably 0.05 mass % or more. The upper limit of the concentration of the first complex ion in Solution a is usually 50 mass % or less, preferably 40 mass % or less, and more preferably 30 mass % or less.

The second complex ions preferably contain at least one element selected from the group consisting of titanium (Ti), zirconium (Zr), hafnium (Hf), silicon (Si), germanium (Ge), and tin (Sn), and more preferably contain silicon (Si), or both silicon (Si) and germanium (Ge), and, still more preferably, the second complex ions are silicon fluoride complex ions.

When, for example, the second complex ions contain silicon (Si), the source of the second complex ions is preferably a compound that contains silicon and fluorine and that is highly soluble in the solution. Specific examples of the source of the second complex ions include $H_2SiF_6$, $Na_2SiF_6$, $(NH_4^+)_2SiF_6$, $Rb_2SiF_6$, and $Cs_2SiF_6$. Of these, $H_2SiF_6$ is preferable, because it is highly soluble in water, and contains no alkali metal element as an impurity. The sources of the second complex ions may be used alone or in combination.

The lower limit of the concentration of the source of the second complex ions in Solution a is usually 5 mass % or more, preferably 10 mass % or more, and more preferably 15 mass % or more. The upper limit of the concentration of the source of the second complex ions in Solution a is usually 80 mass % or less, preferably 70 mass % or less, and more preferably 60 mass % or less.

The lower limit of the concentration of hydrogen fluoride in Solution a is usually 20 mass % or more, preferably 25 mass % or more, and more preferably 30 mass % or more. The upper limit of the concentration of hydrogen fluoride in Solution a is usually 80 mass % or less, preferably 75 mass % or less, and more preferably 70 mass % or less.

Solution b

Solution b contains at least one cation selected from the group consisting of potassium ($K^+$), lithium ($Li^+$), sodium ($Na^+$), rubidium ($Rb^+$), cesium ($Cs^+$) and ammonium ($NH_4^+$), and hydrogen fluoride, and may contain additional components as necessary. Solution b is obtained as an aqueous hydrofluoric acid solution containing, for example, at least one cation selected from the group consisting of potassium ($K^+$), lithium ($Li^+$), sodium ($Na^+$), rubidium ($Rb^+$), cesium ($Cs^+$), and ammonium ($NH_4^+$).

Specific examples of the potassium source containing potassium cation capable of constituting Solution b include water-soluble potassium salts such as KF, $KHF_2$, KOH, KCl, KBr, KI, potassium acetate, and $K_2CO_3$. Of these, $KHF_2$ is preferable, because it is soluble in the solution without reducing the concentration of hydrogen fluoride, and it has a low heat of dissolution and is highly safe.

Specific examples of the sodium source containing sodium cations capable of constituting Solution b include water-soluble sodium salts such as NaF, $NaHF_2$, NaOH, NaCl, NaBr, NaI, sodium acetate, and $Na_2CO_3$.

Specific examples of the rubidium source containing rubidium cations capable of constituting Solution b include water-soluble rubidium salts such as RbF, rubidium acetate, and $Rb_2CO_3$.

Specific examples of the cesium source containing cesium cations capable of constituting Solution b include water-soluble cesium salts such as CsF, cesium acetate, and $Cs_2CO_3$.

Specific examples of the ammonium source containing quaternary ammonium cations capable of constituting Solution b include water-soluble ammonium salts such as $NH_4F$, aqueous ammonia, $NH_4Cl$, $NH_4Br$, $NH_4I$, ammonium acetate, and $(NH_4^+)_2CO_3$. The ion sources constituting Solution b may be used alone or in combination.

The lower limit of the concentration of hydrogen fluoride in Solution b is usually 20 mass % or more, preferably 25 mass % or more, and more preferably 30 mass % or more. The upper limit of the concentration of hydrogen fluoride in Solution b is usually 80 mass % or less, preferably 75 mass % or less, and more preferably 70 mass % or less.

The lower limit of concentration of cations in Solution b is usually 5 mass % or more, preferably 10 mass % or more, and more preferably 15 mass % or more. The upper limit of the concentration of the at least one cation selected from the group consisting of potassium ($K^+$), lithium ($Li^+$), sodium ($Na^+$), rubidium ($Rb^+$), cesium ($Cs^+$), and ammonium ($NH_4^+$) in Solution b is usually 80 mass % or less, preferably 70 mass % or less, and more preferably 60 mass % or less.

The method of mixing Solution a and Solution b is not particularly limited. Solution b may be added while stirring Solution a, or Solution b may be added while stirring Solution a. Alternatively, Solutions a and b each may be charged into a container and mixed by stirring.

Mixing Solution a with Solution b allows the first complex ion, the at least one cation selected from the group consisting of potassium ($K^+$), lithium ($Li^+$), sodium ($Na^+$), rubidium ($Rb^+$), cesium ($Cs^+$), and ammonium ($NH_4^+$), and the second complex ions to react with one another in predetermined proportions to precipitate as crystals of the desired fluoride. The precipitated crystals can be collected by solid-liquid separation through filtration, for example. The precipitated crystals may be washed with a solvent such as ethanol, isopropyl alcohol, water, and acetone. The crystals may be then dried usually at 50° C. or more, preferably at 55° C. or more, and more preferably at 60° C. or more, and usually at 110° C. or less, preferably 100° C. or less, and more preferably 90° C. or less. The drying time is not particularly limited as long as water remaining on the fluoride particles is vaporized, and it is 10 hours, for example.

In mixing Solution a with Solution b, it is preferable to suitably adjust the mixing ratio so as to obtain a product, or fluoride particles, having the intended chemical composition, considering the difference between the initial composition of Solution a and Solution b and the chemical composition of the resultant fluoride particles.

The fluoride particle (core portion) having a chemical composition represented by the formula (I) can also be produced by the production process comprising the step of mixing a first solution containing at least a first complex ion that contains a tetravalent manganese ion and hydrogen fluoride; a second solution containing at least one cation selected from the group consisting of potassium ($K^+$), lithium ($Li^+$), sodium ($Na^+$), rubidium ($Rb^+$), cesium ($Cs^+$), and ammonium ($NH_4^+$), and at least hydrogen fluoride; a third solution containing at least a second complex ion that contains at least a fluorine ion and at least one element selected from the group consisting of elements from Group 4 of the periodic table and elements from Group 14 of the periodic table (hereinafter also called "A second process for producing a fluoride").

By mixing the first solution, the second solution, and the third solution, fluoride particles having the desired composition and the desired weight median size, can be easily produced at high productivity.

First Solution

The first solution may contain at least a first complex ion that contains a tetravalent manganese ion and hydrogen fluoride, and may contain other components as necessary. The first solution is obtained as, for example, an aqueous hydrofluoric acid solution containing a tetravalent manganese source. The manganese source is not particularly limited as long as it is a compound containing manganese. Specific examples of the manganese sources capable of constituting the first solution include $K_2MnF_6$, $KMnO_4$, and $K_2MnCl_6$. Of these, $K_2MnF_6$ is preferable, mainly because it can stably present in hydrofluoric acid in the form of $MnF_6$ complex ions, while maintaining the oxidation number (tetravalent) to be activated. When the manganese source contains at least one cation selected from the group consisting of $K^+$, $Li^+$, $Na^+$, $Rb^+$, $Cs^+$, and $NH_4^+$, it can serve as a source of at least one cation selected from the group consisting of source $K^+$, $Li^+$, $Na^+$, $Rb^+$, $Cs^+$, and $NH_4^+$ to be contained in a second solution. The manganese sources constituting the first solution may be used alone or in combination.

The lower limit of the concentration of hydrogen fluoride in the first solution is usually 20 mass % or more, preferably 25 mass % or more, and more preferably 30 mass % or more. The upper limit of the concentration of hydrogen fluoride in the first solution is usually 80 mass % or less, preferably 75 mass % or less, and more preferably 70 mass % or less. When the hydrogen fluoride concentration is 30 mass % or more, the manganese source (e.g., $K_2MnF_6$) constituting the first solution is more stable to hydrolysis, and the concentration of the tetravalent manganese in the first solution less fluctuates. This facilitates control of the amount of the manganese for activation that is contained in the fluoride fluorescent materials, and is likely to reduce variation (fluctuation) in light emitting efficiency of the fluoride fluorescent materials. When the concentration of hydrogen fluoride is 70 mass % or less, reduction of the boiling point of the first solution can be prevented or reduced, and the generation of hydrogen fluoride gas can be prevented or reduced. This facilitates control of the concentration of hydrogen fluoride in the first solution, effectively reducing the variation (fluctuation) in particle size of the resultant fluoride fluorescent materials.

The concentration of the first complex ion in the first solution is not particularly limited. The lower limit of the concentration of the first complex ion in the first solution is usually 0.01 mass % or more, preferably 0.03 mass % or more, and more preferably 0.05 mass % or more. The upper limit of the concentration of the first complex ion in the first solution is usually 50 mass % or less, preferably 40 mass % or less, and more preferably 30 mass % or less.

Second Solution

The second solution contains hydrogen fluoride and at least one cation selected from the group consisting of $K^+$, $Li^+$, $Na^+$, $Rb^+$, $Cs^+$, and $NH_4^+$, and may contain additional components as necessary. The second solution is obtained, for example, as an aqueous hydrofluoric acid solution that contains at least one cation selected from the group consisting of, for example, $K^+$, $Li^+$, $Na^+$, $Rb^+$, $Cs^+$, and $NH_4^+$. Specific examples of the ion sources containing ions capable of constituting the second solution include water-soluble salts such as NaF, $NaHF_2$, NaOH, NaCl, NaBr, NaI, sodium acetate, $Na_2CO_3$, RbF, rubidium acetate, $Rb_2CO_3$, CsF, cesium acetate, $Cs_2CO_3$, $NH_4F$, aqueous ammonia, $NH_4Cl$, $NH_4Br$, $NH_4I$, ammonium acetate, and $(NH_4^+)_2CO_3$, in addition to potassium-containing salts such as KF, $KHF_2$, KOH, KCl, KBr, KI, potassium acetate, and $K_2CO_3$. Of these, using at least $KHF_2$ is preferable, because it is soluble in the solution without lowering the concentration of hydrogen fluoride, and it has a low heat of dissolution and is highly safe. Besides potassium, $NaHF_2$ is preferable as a source of the ions. The ion sources that constitute the second solution may be used alone or in combination.

The lower limit of the concentration of hydrogen fluoride in the second solution is usually 20 mass % or more, preferably 25 mass % or more, and more preferably 30 mass % or more. The upper limit of the concentration of hydrogen fluoride in the second solution is usually 80 mass % or less, preferably 75 mass % or less, and more preferably 70 mass % or less.

The lower limit of the ion concentration of the at least one cation selected from the group consisting of $K^+$, $Li^+$, $Na^+$, $Rb^+$, $Cs^+$, and $NH_4^+$ in the second solution is usually 5 mass % or more, preferably 10 mass % or more, and more preferably 15 mass % or more. The upper limit of the ion concentration of the at least one cation selected from the group consisting of $K^+$, $Li^+$, $Na^+$, $Rb^+$, $Cs^+$, and $NH_4^+$ in the second solution is usually 80 mass % or less, preferably 70 mass % or less, and more preferably 60 mass % or less.

Third Solution

The third solution contains at least the second complex ions containing fluorine ions and at least one element selected from the group consisting of elements from Group 4 of the periodic table and elements from Group 14 of the periodic table, and may contain additional components as necessary. The third solution can be obtained, for example, as an aqueous solution containing the second complex ions.

The second complex ions preferably contain at least one element selected from the group consisting of titanium (Ti), zirconium (Zr), hafnium (Hf), silicon (Si), germanium (Ge), and tin (Sn), more preferably contain silicon (Si), or silicon (Si) and germanium (Ge), and, still more preferably, the second complex ions are silicon fluoride complex ions.

When the second complex ions contain, for example, silicon (Si), the source of the second complex ions preferably is a compound that contains silicon and fluorine, and is highly soluble in the solution. Specific examples of such sources of the second complex ions include $H_2SiF_6$, $Na_2SiF_6$, $(NH_4^+)_2SiF_6$, $Rb_2SiF_6$, and $Cs_2SiF_6$. Of these, $H_2SiF_6$ is preferable, because it is highly soluble in water and contains no alkali metal element as an impurity. The sources of the second complex ions constituting the third solution may be used alone or in combination.

The lower limit of the concentration of the second complex ions in the third solution is usually 5 mass % or more, preferably 10 mass % or more, and more preferably 15 mass % or more. The upper limit of the concentration of the second complex ions in the third solution is usually 80 mass % or less, preferably 70 mass % or less, and more preferably 60 mass % or less.

The method of mixing the first, second, and third solutions is not particularly limited. The second and third solutions may be added while stirring the first solution, or the first and third solutions may be added while stirring the second solution, or the first and second solutions may be added while stirring the third solution. Alternatively, the first solution, the second solution and the third solution each may be charged into a container and then mixed by stirring.

Mixing the first, second and third solutions allows the first complex ions, at least one cation selected from the group consisting of $K^+$, $Li^+$, $Na^+$, $Rb^+$, $Cs^+$, and $NH_4^+$, and the second complex ions to react with one another in predetermined proportions to precipitate fluoride crystals having a chemical composition represented by the formula (I). The precipitated fluoride particles can be collected by solid-liquid separation through filtration, for example. The precipitated crystals may be washed with a solvent such as ethanol, isopropyl alcohol, water, and acetone. The precipitated crystals may further be dried, usually at 50° C. or more, preferably at 55° C. or more, and more preferably at 60° C. or more, and usually at 110° C. or less, preferably at 100° C. or less, and more preferably at 90° C. or less. The drying time is not particularly limited as long as water remaining on the fluoride particles is vaporized, and is 10 hours, for example.

In mixing the first, second and third solutions, it is preferable to suitably adjust the mixing ratio so as to obtain a product, or fluoride particles, having the intended composition, considering the difference between the initial composition of the first, second and third solutions, and the composition of the resultant fluoride particles.

Second Step

In the second step, a reducing agent is added to the dispersed substance containing fluoride particles that is obtained in the first step. By adding a reducing agent, at least a part of the first complex ions contained in the dispersed substance is preferably reduced to bivalent manganese ions. In the second step, 90 mol % or more of the first complex ions is preferably reduced, and 95 mol % or more is more preferably reduced.

The reducing agent is not particularly limited as long as it can reduce the first complex ions. Specific examples of the reducing agent include hydrogen peroxide and oxalic acid.

Of these, hydrogen peroxide is preferable, because it can reduce the first complex ions with little adverse effect on the fluoride particles, like dissolving the fluoride particles, and it eventually decomposes into water and oxygen, and thus can be advantageously used in the production process imposing less environmental burden.

The amount of the reducing agent is not particularly limited. The amount of the reducing agent can be suitably selected depending, for example, on the content of the first complex ions in the dispersed substance, preferably in such a manner that the concentration of hydrogen fluoride in the dispersed substance is not substantially affected. The specific amount of the reducing agent is preferably 3 equivalent % or more, and more preferably 5 equivalent % or more relative to the content of the first complex ions that are contained in the dispersed substance but not in the fluoride particles in the dispersed substance.

Here, one equivalent means the number of moles of the reducing agent that is required to reduce 1 mole of the first complex ions into divalent manganese ions.

The second step may include, after a reducing agent is added to the dispersed substance, the step of mixing them. The mixing means for mixing the dispersed substance and the reducing agent may be suitably selected from the common mixing means depending, for example, on the reaction container.

The temperature in the second step is not particularly limited. The reducing agent may be added at a temperature in the range of, for example, 15 to 40° C., and preferably at a temperature in the range of 23 to 28° C.

The atmosphere in the second step is not particularly limited. The reducing agent may be added in the ordinary atmosphere, or in an inert gas atmosphere, such as nitrogen gas.

The reaction time in the second step is not particularly limited, and is, for example, 1 min to 30 min, and more preferably 3 min to 15 min.

Third Step

In the third step, a fluoride fluorescent material is obtained by contacting, in the presence of hydrogen fluoride, the second complex ions, at least one cation selected from the group consisting of potassium ($K^+$), lithium ($Li^+$), sodium ($Na^+$), rubidium ($Rb^+$), cesium ($Cs^+$), and ammonium ($NH_4^+$) to the fluoride particles in the dispersed substance to which a reducing agent is added. Contacting the fluoride particles with the second complex ions and at least one cation selected from the group consisting of potassium ($K^+$), lithium ($Li^+$), sodium ($Na^+$), rubidium ($Rb^+$), cesium ($Cs^+$), and ammonium ($NH_4^+$), in the presence of hydrogen fluoride, causes precipitation of, for example, a fluoride containing at least one element selected from the group consisting of elements from Group 4 of the periodic table and elements from Group 14 of the periodic table that are contained in the second complex ions and at least one cation selected from the group consisting of potassium ($K^+$), lithium ($Li^+$), sodium ($Na^+$), rubidium ($Rb^+$), cesium ($Cs^+$), and ammonium ($NH_4^+$) on the surfaces of the fluoride particles to give a desired red-light fluorescent material.

The third step may be performed separately after the second step, or may be performed after the start and before the completion of the second step, or the third step may be performed partly concurrently with the second step.

Because the red-light fluorescent material obtained in the third step is produced by contacting fluoride particles represented by the formula (I) with the second complex ions and at least one cation selected from the group consisting of potassium ($K^+$), lithium ($Li^+$), sodium ($Na^+$), rubidium ($Rb^+$), cesium ($Cs^+$), and ammonium ($NH_4^+$), the resultant red-light fluorescent material includes a surface region having a lower $Mn^{4+}$ concentration than the inner region. The surface region preferably has a composition represented by the following formula (II):

$$K_2[M_{1-y}Mn^{4+}{}_y F_6] \quad \text{(II)}$$

wherein M is at least one element selected from the group consisting of elements from Group 4 of the periodic table and elements from Group 14 of the periodic table, and y satisfies $0<y<x$.

The values of x and y are not particularly limited as long as $0<y<x<0.2$ is satisfied. The value of y can be suitably selected depending, for example, on the desired light emission properties and moisture resistance. The value of y can be controlled, for example, by adjusting the amount of contact of the second complex ions and of at least one cation selected from the group consisting of potassium ($K^+$), lithium ($Li^+$), sodium ($Na^+$), rubidium ($Rb^+$), cesium ($Cs^+$), and ammonium ($NH_4^+$) with fluoride particles in the third step.

The method of contacting fluoride particles in the dispersed substance to which a reducing agent is added with the second complex ions and at least one cation selected from the group consisting of potassium ($K^+$), lithium ($Li^+$), sodium ($Na^+$), rubidium ($Rb^+$), cesium ($Cs^+$), and ammonium ($NH_4^+$) in the third step is not particularly limited. Mixing, for example, a dispersed substance containing a reducing agent with at least one of a solution containing at least one cation selected from the group consisting of potassium ($K^+$), lithium ($Li^+$), sodium ($Na^+$), rubidium ($Rb^+$), cesium ($Cs^+$), and ammonium ($NH_4^+$), and a solution containing the second complex ions is preferable. Mixing a dispersed substance containing a reducing agent with at least one of the second solution and the third solution is more preferable, and mixing a dispersed substance containing a reducing agent with the second solution and the third solution is more preferable. Here, the preferred modes of the second solution and the third solution are as follows.

When a dispersed substance is mixed with at least one of a solution containing at least one cation selected from the group consisting of potassium ($K^+$), lithium ($Li^+$), sodium ($Na^+$), rubidium ($Rb^+$), cesium ($Cs^+$), and ammonium ($NH_4^+$), and a solution containing the second complex ions, the other ions not contained in the solution to be mixed, specifically, either the solution containing at least one cation selected from the group consisting of potassium ($K^+$), lithium ($Li^+$), sodium ($Na^+$), rubidium ($Rb^+$), cesium ($Cs^+$), and ammonium ($NH_4^+$) or the solution containing the second complex ions, would suffice if such other ions are contained in the dispersed substance in an amount necessary for the third step.

The second solution and the third solution of the third step may have the same or different compositions as or from the second solution and the third solutions of the first step, respectively.

When the third step includes mixing a dispersed substance containing a reducing agent with at least one of the solution containing at least one cation selected from the group consisting of potassium ($K^+$), lithium ($Li^+$), sodium ($Na^+$), rubidium ($Rb^+$), cesium ($Cs^+$), and ammonium ($NH_4^+$), and the solution containing the second complex ions, the mixing means may be suitably selected from the common mixing means depending, for example, on the reaction container.

The temperature in the third step is not particularly limited. The step may be performed, for example, at a temperature in the range of 15 to 40° C., and preferably in the range of 23 to 28° C.

The atmosphere in the third step is not particularly limited. The step may be performed in the ordinary atmosphere or in an inert gas atmosphere, such as nitrogen gas.

The reaction time in the second step is not particularly limited, and is, for example, 1 min to 60 min, and more preferably 5 min to 30 min.

When the third step includes mixing a dispersed substance containing a reducing agent with at least one of a solution containing at least one cation selected from the group consisting of potassium ($K^+$), lithium ($Li^+$), sodium ($Na^+$), rubidium ($Rb^+$), cesium ($Cs^+$), and ammonium ($NH_4^+$), and a solution containing the second complex ions, the amount of the solution containing the second complex ions and the solution containing at least one cation selected from the group consisting of potassium ($K^+$), lithium ($Li^+$), sodium ($Na^+$), rubidium ($Rb^+$), cesium ($Cs^+$), and ammonium ($NH_4^+$) relative to fluoride particles in the dispersed substance containing a reducing agent may be appropriately selected, depending, for example, on the intended light emission properties and moisture resistance of the fluoride fluorescent materials. The amount of the second complex ions relative to fluoride particles may be, for example, 1 mol % to 40 mol %, and preferably 5 mol % to 30 mol %.

Additional Step

The process for producing a red-light fluorescent material may include an additional step, as necessary. The red-light fluorescent material produced in the third step, for example, can be collected by solid-liquid separation through filtration, for example. The red-light fluorescent material may be washed with a solvent such as ethanol, isopropyl alcohol, water, and acetone. The red-light fluorescent material may be then dried, for example at 50° C. or more, preferably 55° C. or more, more preferably 60° C. or more, and, for example, at 110° C. or less, preferably 100° C. or less, and more preferably 90° C. or less. The drying time is not particularly limited as long as water remaining on the red-light fluorescent material is vaporized, and it is 10 hours, for example.

Another Fluorescent Material

The light emitting device preferably includes another fluorescent material in addition to the red-light fluorescent material. Any fluorescent material may be used that absorbs light from the light source and changes the wavelength of the light to a different wavelength. Like the red-light fluorescent material, another fluorescent material is also contained in the encapsulation resin that constitutes the light emitting device.

Another fluorescent material may be preferably at least one selected from the group consisting of, for example, nitride fluorescent materials, oxynitride fluorescent materials, and sialon fluorescent materials that are mainly activated by a lanthanoid element such as Eu and Ce; alkaline-earth halogenapatite fluorescent materials, alkaline-earth metal borate halogen fluorescent materials, alkaline-earth metal aluminate fluorescent materials, alkaline-earth silicates, alkaline-earth sulfides, alkaline-earth thiogallates, alkaline-earth silicon nitrides, and germanate salts that are mainly activated by a lanthanoid element, such as Eu or a transition metal element, such as Mn; rare-earth aluminate and rare-earth silicate that are mainly activated by a lanthanoid element such as Ce; and at least one selected from an organic compound and an organic complex mainly activated by a lanthanoid element such as Eu.

Specific examples of another fluorescent materials include $(Ca,Sr,Ba)_2SiO_4$:Eu, $(Y,Gd,Lu)_3(Ga,Al)_5O_{12}$:Ce, $(Si,Al)_6(O,N)_8$:Eu(β-sialon), $(Ba,Sr,Ca)Ga_2S_4$:Eu, $(Ca,Sr)_2Si_5N_8$:Eu, $CaAlSiN_3$:Eu, $(Ca,Sr)AlSiN_3$:Eu, $(Ca,Sr,Ba,Zn)_8MgSi_4O_{16}$:Eu, $(Ca,Sr,Ba,Zn)_8MgSi_4O_{16}(F,Cl,Br,I)_2$:Eu, $La_3Si_6N_{11}$:Ce, $Ca_3Sc_2Si_3O_{12}$:Ce, $CaSc_2O_4$:Ce, and $Ba_3Si_6O_{12}N_2$:Eu.

By including additional fluorescent materials, light emitting devices with a wide variety of color tones can be provided.

When such additional fluorescent materials are included in the light emitting device, the amount of such additional fluorescent materials contained are not particularly limited and may be adjusted so as to achieve the desired light-emitting properties.

When the light emitting device includes additional fluorescent materials, it preferably includes a green to yellow-light emitting fluorescent material, and more preferably a green to yellow-light emitting fluorescent material that absorb light in the wavelength range of 380 nm to 485 nm, and emit light having a wavelength range of 495 nm to 590 nm. The light emitting devices including a green to yellow-light emitting fluorescent material is more suitable for use in liquid crystal displays. When the light emitting device includes a plurality of light emitting elements, for example, a light emitting element that emits blue light and a light emitting element that emits green to yellow light, the emission colors of green to yellow light can be obtained by the light emitting elements, and thus a green to yellow-light emitting fluorescent material is not an essential constituent for the light emitting device according to this embodiment.

Such a green to yellow-light emitting fluorescent material is preferably at least one fluorescent material selected from the group consisting of β-sialon represented by the compositional formula $(Si,Al)_6(O,N)_8$: Eu; halosilicate represented by the compositional formula $(Ca,Sr,Ba,Zn)_8MgSi_4O_{16}(F,Cl,Br,I)_2$: Eu; alkaline-earth thiogallate represented by the compositional formula $(Ba,Sr,Ca)Ga_2S_4$:Eu; and a rare-earth aluminate fluorescent material represented by the compositional formula $(Y,Lu)_3(Al,Ga)_5O_{12}$:Ce. Such a green to yellow-light emitting fluorescent material may be used alone or in combination.

Content of Fluorescent Material in Encapsulation Material (Resin Composition)

The content of the fluorescent materials in an encapsulation material (resin composition) is preferably 1 to 200 mass parts relative to 100 mass parts of the resin, more preferably 5 to 195 mass parts, still more preferably 10 to 190 mass parts, and particularly preferably 15 to 185 mass parts, and most preferably 20 to 180 mass parts. With the content of the fluorescent materials within this range in a resin composition, the light emitting element can be fully covered, the wavelength of the light emitted from the light emitting element can be efficiently converted by the fluorescent materials, and the light emitting device can effectively emit light. With the content of the fluorescent materials in the resin composition being 1 to 200 mass parts relative to 100 mass parts of the resin, an encapsulation member that contains particles of a red-light fluorescent material alone or of a red-light fluorescent material and a non-red-light fluorescent material, and that covers the light emitting device with a uniform thickness can be formed.

Mass ratio of green to yellow-light emitting fluorescent material to red-light fluorescent material When the fluorescent materials includes a red-light fluorescent material and a green to yellow-light emitting fluorescent material, the mass ratio of the green to yellow-light emitting fluorescent material to the red-light fluorescent material (the green to yellow-light emitting fluorescent material: the red-light fluorescent material) is preferably 5:95 to 95:5, more preferably 10:90 to 90:10, still more preferably 20:80 to 80:20, and particularly preferably 25:75 to 75:25. When the green to yellow-light emitting fluorescent material includes a red-light fluorescent material within this range, the red-light fluorescent material contains a fluoride having a chemical composition represented by the formula (I), and thus has a narrow half bandwidth of the emission spectrum, with a large gap from the peak of the emission spectrum that emits green to yellow. This enables the light emitting device to absorb the light from light emitting elements and to emit light with a high color gamut and high emission output.

Other Materials

The encapsulation material (resin composition) that constitutes encapsulation member contains at least a resin, a fluorescent material, and nanoparticles, and a filler as necessary. The encapsulation material may further contain, for example, a curing agent for curing a resin. Additionally, the encapsulation material may also contain a dye and a pigment, for example. The material may also contain pores (voids) for dispersing light to the extent not to cause adverse effects.

Process for Producing Encapsulation Material (Resin Composition)

The process for producing an encapsulation material (resin composition) is not particularly limited, and there is no limitation to the mixing orders of the materials.

The resin composition may be produced by mixing predetermined amounts of materials at the same time, or mixing predetermined amounts of materials sequentially. The encapsulation material (resin composition) is preferably produced by introducing a resin, a fluorescent material, nanoparticles, a filler, and the other materials into a container in this order, and mixing them.

Figure 2:
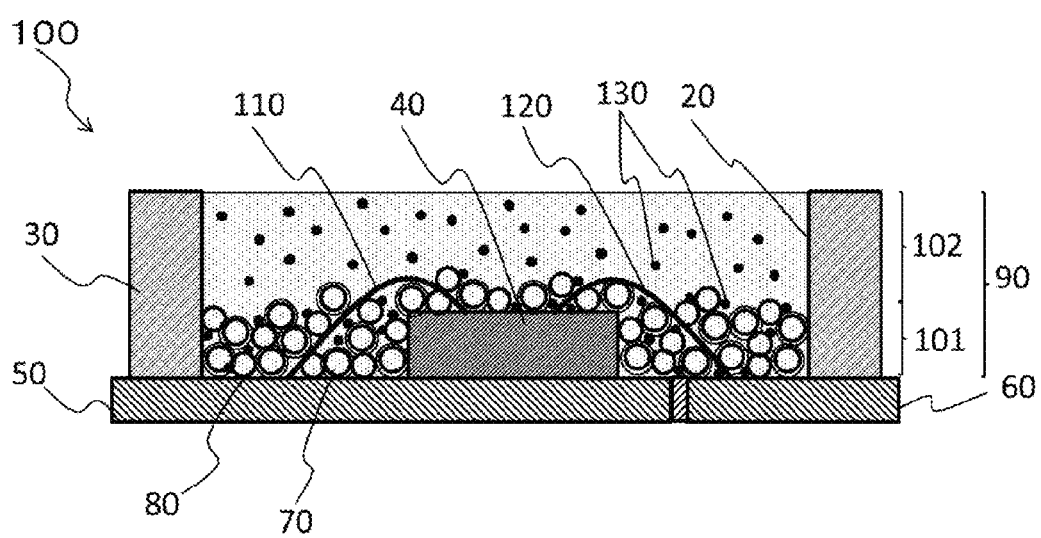
FIG. 2 is a schematic sectional view of another example of a light emitting device according to a second example embodiment.

FIG. 2 is a view illustrating a schematic structure of the light emitting device 100 according to the second embodiment. As shown in FIG. 2, the light emitting device 100 includes a package 30, a light emitting element 40 disposed on the package 30, and an encapsulation member 90 that covers the light emitting element 40. The encapsulation member 90 includes a first section 101 that contains a red-light fluorescent material 70 and a non-red-light fluorescent material 80, and that covers the light emitting element 40, and a second section 102 that is provided on the first section 101 and that contains substantially no fluorescent materials. The package 30 has side walls that define a recess 20. The package 30 integrally includes, at its bottom, a first lead 50 and a second lead 60. The light emitting device 100 according to the second embodiment is the same as the light emitting device 1 according to the first embodiment, except that the light emitting device 100 includes the encapsulation member 90 that includes the first section 101 and the second section 102. The encapsulation member 90 includes nanoparticles 130. The first section 101 and the second section 102 both contain nanoparticles 130.

In FIG. 2, the red-light fluorescent material 70, the non-red-light fluorescent material 80, and nanoparticles 130 are not to scale, merely schematically illustrating the red-light fluorescent material 70, the non-red-light fluorescent material 80, and nanoparticles 130.

In the present specification, the second section "contains substantially no fluorescent materials" in the second section indicates that there are essentially no fluorescent materials in the second section, and that the content of the fluorescent material is 1 mass % or less relative to the total mass of the second section, although this is not limitative.

First Section and Second Section

The first section 101 and the second section 102 constitute the encapsulation member 90 that encapsulates the light emitting element 40. The first section 101 and the second section 102 are composed of the above-described resin composition, which is the encapsulation material. The first section 101 and the second section 102 are formed as follows: The resin composition as an encapsulation material is injected into the recess 20 of the package 30, in which the light emitting element 40 is disposed. The particles of the red-light fluorescent material 70 and of the non-red-light fluorescent material 80 are then centrifugally settled on the side of the light emitting element 40, and subsequently the resin is cured to cover the light emitting element 40, thereby forming the first section 101, which contains the red-light fluorescent material 70, the non-red-light fluorescent material 80, the resin, and the nanoparticles, and the second section 102, which is provided on the first section 101, and contains the resin, the nanoparticles, and substantially none of the red-light fluorescent material 70 and the non-red-light fluorescent material 80. The red-light fluorescent material 70 is $Mn^{4+}$ activated, has a chemical composition represented by the formula (I), and includes a surface region having a lower $Mn^{4+}$ concentration than the inner region of the fluorescent material. The non-red-light fluorescent material 80 is not the above-described red-light fluorescent material but a green to yellow-light emitting fluorescent material. After centrifugal settling, the nanoparticles 130 are substantially uniformly dispersed both in the first section 101 and in the second section 102. Here, the state where the nanoparticles are substantially uniformly dispersed in the first section and/or the second section indicates that in any cross-section observed of the first section and/or the second section, the primary particle size of the nanoparticles that exist there is within a given range, that the difference between the number of the nanoparticles that exist in a given area and the average number of such nanoparticles is limited to a predetermined range, and that the nanoparticles are not unevenly or locally distributed in any cross-section. For example, if the nanoparticles are not unevenly dispersed in multiple locations, under electron microscopy observation at any magnification within any visual field range, in any cross section of the nanoparticles in the first section and/or the second section, then the nanoparticles can be said to be substantially uniformly dispersed.

The first section 101 contains particles of the red-light fluorescent material 70 that have a chemical composition represented by the formula (I), and that have a surface region with a lower tetravalent manganese ion concentration than the inner region of the fluorescent material. The particles of the fluorescent material, including the particles of the red-light fluorescent material 70, are fully dispersed in the resin composition, and then accumulated on the light emitting element due to the centrifugal settling but not being too dense, whereby the resin composition is separated into two layers, the first section 101 and the second section 102.

Since the first section 101 and the second section 102 are made of the same resin, losses in emission output can be reduced. Furthermore, since the light emitting element 40 is covered with the red-light fluorescent material 70 and the non-red-light fluorescent material 80, the wavelength of the light emitted from the light emitting element can be efficiently converted by the fluorescent materials, and the light can be emitted efficiently.

In a conventional tetravalent manganese ion ($Mn^{4+}$)-activated red-light fluorescent materials, the tetravalent manganese ion in the red-light fluorescent material may react with water in the air on the particle surface to generate manganese dioxide, which discolors the particle surface, resulting in chromaticity change and reduction in emission output.

In the light emitting device 100, the light emitting surface is composed of the second section 102, and water in the air that enters through, for example, the interface between the air and the package 30 is blocked by the second section 102. The second section 102 blocks water in the air from reaching the red-light fluorescent material 70 contained in the first section 101. Thus, the reaction of water with the tetravalent manganese ion contained in the tetravalent manganese ion ($Mn^{4+}$)-activated red-light fluorescent material can be reduced, and discoloration of the particle surface due to the generation of manganese dioxide can be reduced. Hence, the light emitting device according to one mode of this disclosure can reduce losses in emission output and generation of chromaticity change, demonstrating full moisture resistance in a long-term reliability test.

In the light emitting device 100, the red-light fluorescent material particles are separated from the uppermost top surface of the encapsulation member by the second section 102. Thus the water in the air is unlikely to reach the red-light fluorescent material particles contained in the first section 101. This reduces the deterioration of the red-light fluorescent material. In a case where the red-light fluorescent material reacts with water, $Mn^{4+}$ and F contained in the red-light fluorescent material would elute, and the resin that forms the first section 101 and the second section 102 would become discolored. The above-described configuration can prevent or reduce the red-light fluorescent material from reacting with water, and also can prevent or reduce discoloration of the resin that forms the first section 101 and the second section 102.

The second section 102 preferably has a thickness, immediately above the light emitting element, of 1/10 or more of the entire thickness of the encapsulation member. With the thickness of the second section 102, immediately above the light emitting element, being 1/10 or more of the entire thickness of the encapsulation member, the above-described effects can be achieved, and the light converted by the fluorescent material can be efficiently released to the outside of the light emitting device.

The second section 102 preferably has a thickness, immediately above the light emitting element, of 1/4 or more of the entire thickness of the encapsulation member. With the thickness of the second section 102, immediately above the light emitting element, being 1/4 or more of the entire thickness of the encapsulation member, water in the air is blocked by the second section 102 and is unlikely to reach the fluorescent material particles that are contained in the first section 101, and the reaction between water and the tetravalent manganese ion that is contained in the tetravalent manganese ion ($Mn^{4+}$)-activated red-light fluorescent material 70 in the first section 101 is prevented or reduced, thereby efficiently preventing or reducing discoloration of the particle surface due to the generation of manganese dioxide.

Content of the Fluorescent Material in the First Section

The content of the fluorescent material in the first section 101 is preferably 20 to 400 mass parts, more preferably 25 to 380 mass parts, still more preferably 30 to 350 mass parts, and particularly preferably 35 to 300 mass parts relative to 100 mass parts of the resin in the first section 101. With the content of the fluorescent material in the first section 101 being in the above-described range, the light emitting element can be covered with the fluorescent material that has a uniform thickness. Thus, the wavelength of the light from the light emitting element can be efficiently converted with the fluorescent material.

Process for Producing of the Light Emitting Devices (First Embodiment)

The process for producing the light emitting device according to this disclosure includes, as a first embodiment, the steps of preparing a package having side walls that define a recess; arranging the light emitting element in the recess; injecting the above-described resin composition into the recess; and covering the light emitting element with the resin composition, and curing the resin composition to form an encapsulation member.

Hereinbelow, the process for producing the light emitting device will be explained referring to FIG. 1.

Step of Preparing a Package

The package 3 will be prepared. According to the first embodiment, the package 3 has side walls. The package 3 has a first lead 5 and a second lead 6 that integrally constitute the bottom of the recess 2.

Step of Arranging the Light Emitting Element

The light emitting element 4 is arranged on and bonded by die bonding with the first lead 5 that constitutes the bottom of the recess 2 of the package 3. The negative and positive electrodes (not shown) of the light emitting element 4 are bonded with the first lead 5 and the second lead 6 using wires 11 and 12, respectively. The production process of the light emitting device according to this disclosure may further include, as necessary, the step of covering the light emitting element 4, the first lead 5, the second lead 6, and the wires 11 and 12 with an insulating member (not shown). The insulating member is preferably formed, by sputtering or deposition, as a film (layer) of an inorganic compound on the first lead 5 and the second lead 6 (conductive member), the wires 11 and 12, and the light emitting element 4. The insulating member is more preferably formed as a film (layer) by Atomic Layer Deposition (ALD).

Covering step Next, an encapsulation material containing a resin (not shown), nanoparticles 13, a filler (not shown) as necessary, and the particles of the red-light fluorescent material 7, and the particles of the non-red-light fluorescent material 8 are injected into the recess 2 of the package 3, and the light emitting element 4 arranged in the package 3 is covered with the encapsulation material. Specifically, the encapsulation material (resin composition) is filled in the recess 2 and the light emitting element 4 is covered. The resin composition is preferably injected into a plurality of recesses 2 of a plurality of packages 3 using a syringe, for example. The resin composition may contain other materials as necessary.

Curing Step

In the curing step, the resin composition that is filled in the recess 2 of the package 3 undergoes curing treatment. This step completes a light emitting device including the encapsulation member 9, which is formed from the above-described resin composition and covers the light emitting element 4. The curing method of the resin is not particularly limited, and may be suitably selected according to the resin used. The nanoparticles 13 contained in the resin composition are substantially uniformly dispersed in the encapsulation member 9.

Process for Producing the Light Emitting Device (Second Embodiment)

The second embodiment according to the process for producing the light emitting device of this disclosure will be explained.

In the process for producing the light emitting device according to the second embodiment, the steps of preparing a package having side walls that define a recess; and arranging the light emitting element in the recess are the same as those in the first embodiment.

The second embodiment relating to a process for producing a light emitting device includes, before the curing step, which was described in the first embodiment, the step of centrifugally settling the particles of a fluorescent material on the side that the light emitting element is arranged in the encapsulation material (resin composition), covering the light emitting element. Providing the step of centrifugal settling before curing the resin enables forming of an encapsulation member that includes a first section that contains resin, the nanoparticles, and the particles of the fluorescent material and that covers the light emitting element, and a second section that is provided on the first section and contains resin, the nanoparticles, and substantially no fluorescent material. Hereinbelow, the step of centrifugally settling the particles of the fluorescent material, and the final step of curing the resin composition to form an encapsulation member will be described, referring to FIG. 2.

Step of Centrifugally Settling Fluorescent Material

As shown in FIG. 2, an encapsulation material (resin composition) is injected into the recess 20, which is defined by the side walls of the package 30, to fill the recess 20 with the encapsulation material (resin composition). Due to the centrifugal force forcibly applied to the package 30 that is filled with the encapsulation material (resin composition), the particles of the red-light fluorescent material 70 and of the non-red-light fluorescent material 80 in the resin composition are centrifugally settled in such a manner to cover the light emitting element 40. Curing the resin thereafter provides an encapsulation member 90, which is formed from the resin composition, including a first section 101 that contains the particles of the fluorescent materials and that covers the light emitting element, and a second section 102 that is provided on the first section 101 and that contains substantially no fluorescent materials. In the centrifugal settling step, the package 30 including the recess 20 that is filled with the resin composition, is preferably put into a magazine and rotated until the particles of the fluorescent materials fully settle due to centrifugal force.

Centrifugal settling of the fluorescent material is effected by causing the direction of the resultant force of the centrifugal force and gravity to conform to the direction vertical to the bottom surface of the package where the light emitting element is arranged. Here, the bottom of the package includes the first lead 50 and the second lead 60 on which the light emitting element is disposed. By causing the direction of the resultant force of the centrifugal force and gravity to conform to the direction vertical to the bottom surface of the package, the particles of the fluorescent material dispersed in the resin composition settle with a uniform thickness on the light emitting element and the bottom surface of the package, thereby forming the first section 101 with a uniform thickness.

The centrifugal settling of the particles of the fluorescent material is preferably conducted such that the second section 102 has a thickness, immediately above the light emitting element 40, of $\frac{1}{10}$ of the entire thickness of the resin composition. The thickness of the second section 102 can be controlled by adjusting the conditions of the centrifugal settling, the type and the amount of the resin and the type and the amount of the fluorescent material in the encapsulation material as appropriate. By setting the conditions, the fluorescent material can be centrifugally settled so that the second section has a thickness of $\frac{1}{10}$ or more of the entire thickness of the encapsulation material (resin composition).

The centrifugal settling of the fluorescent material is preferably conducted such that the second section 102 has a thickness, immediately above the light emitting element 40, of $\frac{1}{4}$ or more of the entire thickness of the encapsulation material. By adjusting the conditions of the centrifugal settling, the type and the amount of the resin and the type and the amount of the fluorescent material in the encapsulation material (the resin composition) as appropriate, the particles of the fluorescent material can be centrifugally settled so that the second section 102 has a thickness of $\frac{1}{4}$ or more of the entire thickness of the encapsulation material (resin composition).

The nanoparticles 130 contained in the resin composition are substantially uniformly dispersed in the first section 101, irrespective of the centrifugal settling of the fluorescent material, and are substantially uniformly dispersed also in the second section 102.

Curing Step

After the centrifugal settling of the fluorescent material, the resin is cured. With the formation of a curing product of the encapsulation material (resin composition), which is injected into the recess 20 of the package 30, a light emitting device 100 that includes an encapsulation member 90 is provided. The encapsulation member 90 is composed of the first section 101 that contains the red-light fluorescent material 70 and the non-red-light fluorescent material 80, and that covers the light emitting element 40, and the second section 102 that is provided on the first section 101 and that contains substantially no red-light fluorescent material 70. The method of curing the resin is not particularly limited, and may be suitably selected depending on the resin used.

Image Display Apparatus

An image display apparatus includes at least one light emitting device described above. The image display apparatus is not particularly limited as long as it includes the light emitting device, and may be appropriately selected from conventional image display apparatuses. An image display apparatus includes, in addition to the above-described light emitting device, a color filter member and an optical transmission control member, for example.

EXAMPLES

Hereinbelow, the present embodiment will be specifically described by means of Examples, but the present embodiment is not limited to those Examples.

Production Example 1 of Red-Light Fluorescent Material

To have an initial composition ratio as shown in Table 1, 21.66 g of $K_2MnF_6$ was weighed and dissolved into 800 g of a 55 wt % aqueous solution of HF, and then 400 g of a 40 wt % aqueous solution of $H_2SiF_6$ was added to prepare solution A. Separately, 260.14 g of $KHF_2$ was weighed and dissolved into 450 g of a 55 wt % aqueous solution of HF to prepare solution B. Additionally, 200 g of a 40 wt % aqueous solution of $H_2SiF_6$ was weighed to have solution C.

Next, solution B and solution C were simultaneously added dropwise to solution A under stirring at room temperature (23 to 28° C.) to precipitate fluorescent material crystals (fluoride particles). The dropwise addition was once stopped when 75 wt % of the dropwise addition of solution B and solution C was each completed, as shown in Table 2 (the first step).

As a reducing agent, 15 g of a 30% aqueous solution of $H_2O_2$ was weighed and added to solution A (the second step), and then dropwise addition of solution B and solution C was resumed (the third step). After completion of the dropwise addition of solution B and solution C, the resultant precipitate was separated, washed with IPA (isopropyl alcohol), and dried at 70° C. for 10 hours to prepare a red-light fluorescent ($K_2[Si_{0.97}Mn^{4+}_{0.03}F_6]$) material 1 of Production Example 1. The red-light fluorescent material 1 of Production Example 1 has a surface region with a lower tetravalent manganese ion concentration than the inner region of the fluorescent material.

TABLE 1

| | Initial composition ratio (mol) | | | | Solution A Initial amount (g) | | | Solution B Initial amount (g) | | Solution C Initial amount (g) | Reducing agent (g) |
|---|---|---|---|---|---|---|---|---|---|---|---|
| | K | Si | Mn | F | $K_2MnF_6$ | 40% aqueous solution of $H_2SiF_6$ | 55% aqueous solution of HF | $KHF_2$ | 55% aqueous solution of HF | 40% aqueous solution of $H_2SiF_6$ | 30% aqueous solution of $H_2O_2$ |
| Production Example 1 | 2 | 0.95 | 0.05 | 6 | 21.66 | 400 | 800 | 260.14 | 450 | 200 | 15 |

TABLE 2

| | Percentage of dropwise addition before addition of reducing agent (%) | |
|---|---|---|
| | Solution B | Solution C |
| Production Example 1 | 75 | 75 |

Production Example 2 of Red-Light Fluorescent Material

The red-light fluorescent material 2 ($K_2[Si_{0.97}Mn^{4+}_{0.03}F_6]$) of Production Example 2 was prepared in the same manner as that of Production Example 1, except that the second step in Production Example 1 of the red-light fluorescent material was omitted. The red-light fluorescent material 2 of Production Example 2 lacks a surface region having a lower $Mn^{4+}$ concentration than the inner region.

Example 1

Production of Encapsulation Material (Resin Composition)

As the red-light fluorescent material, the red-light fluorescent material of Production Example 1 was used. As the green to yellow-light emitting fluorescent material, (Si,Al)$_6$(O,N)$_8$:Eu(β-sialon) was used. The green to yellow-light emitting fluorescent material and the red-light fluorescent material were formulated so that the mass ratio of the green to yellow-light emitting fluorescent material and the red-light fluorescent material was 27:73 (the green to yellow-light emitting fluorescent material: the red-light fluorescent material). As the resin, phenyl silicone (Dow Corning (Registered Trademark: OE-6630)) was used. As the nanoparticles, silica nanoparticles (silicon oxide nanoparticles) having a number average primary particle size of 12 nm, as determined by TEM, were used. As the filler, silica (silicon oxide) having a volume average particle size (median size: d50) of 11 μm, as determined by a laser differential scattering particle size analyzer (MASTER SIZER 2000 by MALVERN), was used. The formulation of the components is as follows.

A container for stirring was charged with a resin and fluorescent materials (a red-light fluorescent material and a green to yellow-light emitting fluorescent material), and then with silica nanoparticles and a filler. The mixture was stirred for about 5 minutes to obtain an encapsulation material (resin composition) 1.

Resin Composition 1

| | |
|---|---|
| Phenyl silicone resin material (Agent A) | 20 mass parts |
| Red-light fluorescent material (Production Example 1), average particle size: 28 μm | 31.57 mass parts (43.25 mass parts × 0.73) |
| Green to yellow-light emitting fluorescent material (β-sialon), average particle size: 15 μm | 11.68 mass parts (43.25 mass parts × 0.27) |
| Silica nanoparticles (silica, the number average primary particle size: 12 nm) | 0.4 mass parts |
| Filler (silica, volume average secondary particle size: 11 μm) | 5 mass parts |
| Phenyl silicone resin material (Agent B) | 80 mass parts |

Process for Producing the Light Emitting Device

A package having side walls that define a recess was prepared. Into the recess, a light emitting element was disposed, and then resin composition 1 was injected into the recess of the package using a syringe. A light emitting element having an emission peak wavelength of about 445 nm was used. The light emitting element was covered with resin composition 1 that was injected into the recess of the package. The resin composition was then cured to form an encapsulation member 9, and a light emitting device of Example 1 was completed. In the encapsulation member 9, silica nanoparticles were substantially uniformly dispersed.

Comparative Example 1

Resin composition 2 was produced in the same manner as resin composition 1 except that a red-light fluorescent material 2, which differs from the red-light fluorescent material used in Example 1, was used. This red-light fluorescent material 2 is the red-light fluorescent material in Production Example 2 and has no surface region that has a lower $Mn^{4+}$ concentration than the inner region of the fluorescent material. The light emitting device of Comparative Example 1 was produced in the same manner as Example 1, except that resin composition 2 was used.

Comparative Example 2

Resin composition 3 was produced in the same manner as resin composition 1, except that the resin composition contains no silica nanoparticles nor a filler. The light emitting device of Comparative Example 2 was produced in the same manner as Example 1, except that resin composition 3 was used.

Comparative Example 3

Resin composition 4 was produced in the same manner as resin composition 2 except that red-light fluorescent material 2, which differs from the red-light fluorescent material used in Example 1, was used and that the resin composition contains no silica nanoparticles nor a filler. The light emitting device of Comparative Example 3 was produced in the same manner as Example 1, except that resin composition 4 was used.

PCT (Pressure Cooker Test)

The light emitting devices of Example 1 and Comparative Examples 1 to 3 were subjected to a pressure cooker test (PCT) under the conditions of 121° C., 100% humidity, 2 atmospheric pressure (atm), and 100 hours. The results are shown in Table 3 and FIG. 3.

Table 3 shows whether the red-light fluorescent material has the above-defined surface region or not, whether the silica nanoparticles are contained or not, whether the encapsulation member has the above-defined first section and the second section, and whether discoloration after 100 hour-PCT test is observed for the light emitting devices of Example 1 and Comparative Examples 1 to 3.

As for the surface region, "Yes" indicates that the red-light fluorescent material in question has a surface region with a lower tetravalent manganese ion concentration than the inner region of the fluorescent material, and "No" indicates that the red-light fluorescent material has no such a surface region. As for silica nanoparticles, "Yes" indicates that silica nanoparticles are contained in the resin composition, which constitutes the encapsulation member of the light emitting device in question, and "No" indicates that no silica nanoparticles are contained. As for the first section and the second section, "Yes" indicates that the encapsulation member of the light emitting device in question has the above-defined first section and the second section, and "No" indicates that the encapsulation member has no first and second sections.

The presence of discoloration after the PCT test was evaluated according to the following scale.
A: No discoloration
B: Slight discoloration
C: Noticeable discoloration

TABLE 3

| | Presence of Surface region in Red-light fluorescent material | Presence of Silica nano-particles | Presence of First section and Second section | Results of 100 hour-PCT test (presence of discoloration) |
|---|---|---|---|---|
| Example 1 | Yes | Yes | No | A |
| Comparative Example 1 | No | Yes | No | B |
| Comparative Example 2 | Yes | No | No | B |
| Comparative Example 3 | No | No | No | C |

Figure 3A:
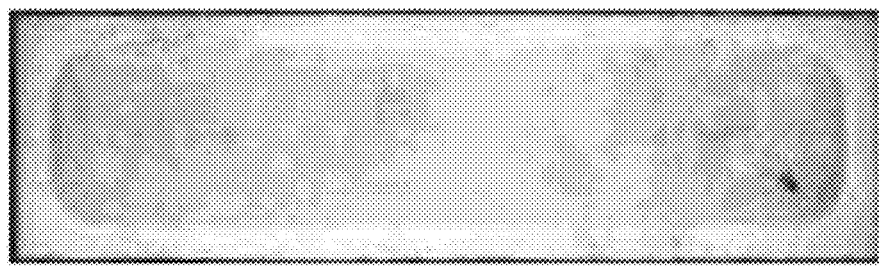
FIGS. 3A to 3D are photographs showing the results of a pressure cooker test (PCT) of the light emitting devices of Example 1 and Comparative Examples 1 to 3.

FIG. 3A is a photograph of the light emitting device of Example 1, taken after 100 hours of PCT.

As shown in FIG. 3A, no discoloration was observed on the surface of the light emitting device of Example 1 after 100 hours of PCT. The results shown in FIG. 3A indicates that the light emitting device of Example 1 is superior in durability.

Figure 3B:
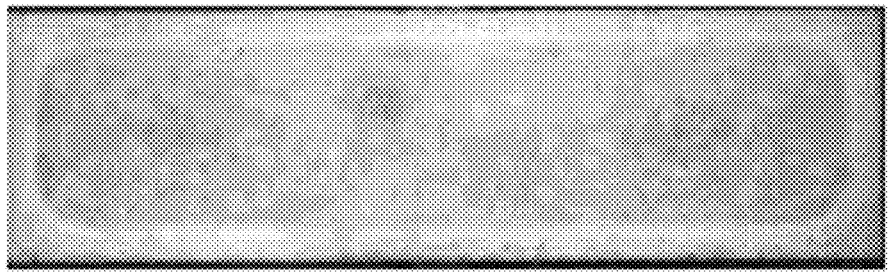

FIG. 3B shows a photograph of the light emitting device of Comparative Example 1, taken after 100 hours of PCT.

As shown in FIG. 3B, slight discoloration was observed on the surface of the light emitting device of Comparative Example 1 after 100 hours of PCT. It is inferred that the reaction between the tetravalent manganese ions and water on the surfaces of the particles of the red-light fluorescent material, which has no surface region, was not prevented or reduced, unlike Example 1, allowing generation of manganese dioxide on the surfaces of the particles of the red-light fluorescent material.

Figure 3C:
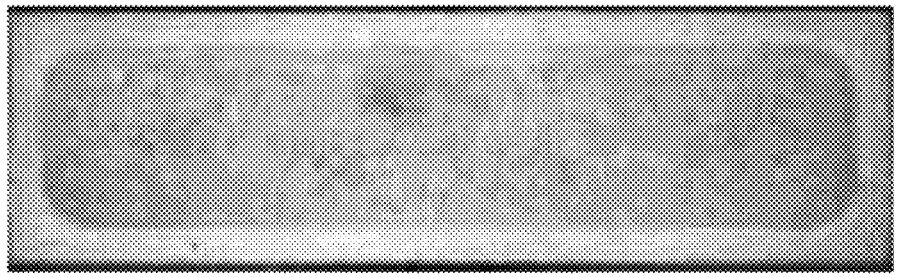

FIG. 3C is a photograph of the light emitting device of Comparative Example 2, taken after 100 hours of PCT.

As shown in FIG. 3C, slight discoloration was observed on the surface of the light emitting device of Comparative Example 2 after 100 hours of PCT. It is inferred that since the resin composition contains no silica nanoparticles, the reaction between tetravalent manganese ions and water on the surfaces of the particles of the red-light fluorescent material was not prevented or reduced, unlike Example 1, allowing generation of manganese dioxide on the surfaces of the particles of the red-light fluorescent material.

Figure 3D:
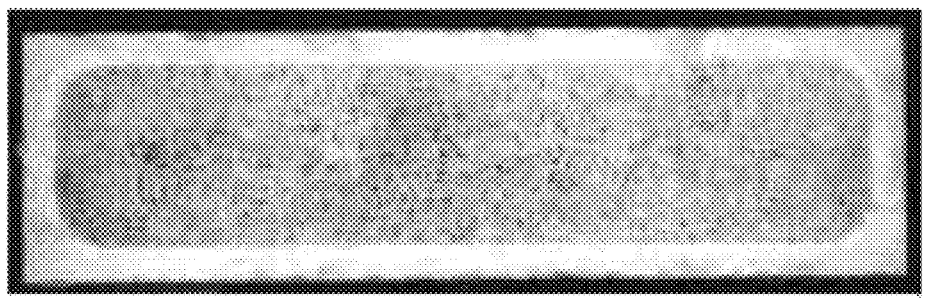

FIG. 3D is a photograph of the light emitting device of Comparative Example 3, taken after 100 hours of PCT.

As shown in FIG. 3D, discoloration was observed on the surface of the light emitting device of Comparative Example 3 after 100 hours of PCT. It is inferred that the reaction between tetravalent manganese ions and water on the surfaces of the particles of the red-light fluorescent material that contains no silica nanoparticles in the resin composition and that has no surface region with a lower $Mn^{4+}$ concentration than the inner region of the fluorescent material, was less reduced than in Comparative Examples 1 and 2, allowing generation of manganese dioxide on the surfaces of the particles of the red-light fluorescent material.

Example 2

Process for Producing the Light Emitting Device

Referring to FIG. 2, a package 30 having side walls that define a recess 20 was prepared. Into the recess 20, a light emitting element 40 was disposed, and then resin composition 1 was injected into the recess 20 of the package 30, using a syringe. As the light emitting element 40, a light emitting element having an emission peak wavelength of about 445 nm was used.

The package 30 including the recess 20 that is filled with resin composition 1 was then put into a magazine and fully rotated in a centrifuge to allow the particles of the red-light fluorescent material 70 and the non-red-light fluorescent material 80 contained in resin composition 1 to settle under the centrifugal force. By curing the resin composition 1 that was injected into the recess 20 of the package 30, an encapsulation member 90 including a first section 101 that contains the red-light fluorescent material 70 and the non-red-light fluorescent material 80, and that covers the light emitting element 40, and a second section 102 that is provided on the first section 101 and contains substantially no fluorescent materials, was formed. Before curing, the second section 102 had a thickness, immediately above the light emitting element 40, of ¹⁄₁₀ or more of the entire thickness of the encapsulation material (resin composition 1). After curing, immediately above the light emitting element 40, specifically, the entire thickness of the encapsulation member 90 is 410 μm, the first section 101 had a thickness of 150 μm, and the second section 102 had a thickness of 260 μm.

In the step of settling the fluorescent materials under centrifugal force, centrifugal settling of the fluorescent materials was effected by causing the direction of the resultant force of the centrifugal force and gravity to conform to the direction vertical to the bottom surface of the package where the light emitting element is arranged.

Subsequently, the resin composition 1 was cured to form an encapsulation member 90 including the first section 101 that contains the red-light fluorescent material 70 and the non-red-light fluorescent material 80, and that covers the light emitting element 40, and the second section 102 that is provided on the first section 101, and that contains substantially no fluorescent material, and a light emitting device of Example 2 was completed.

Figure 4:
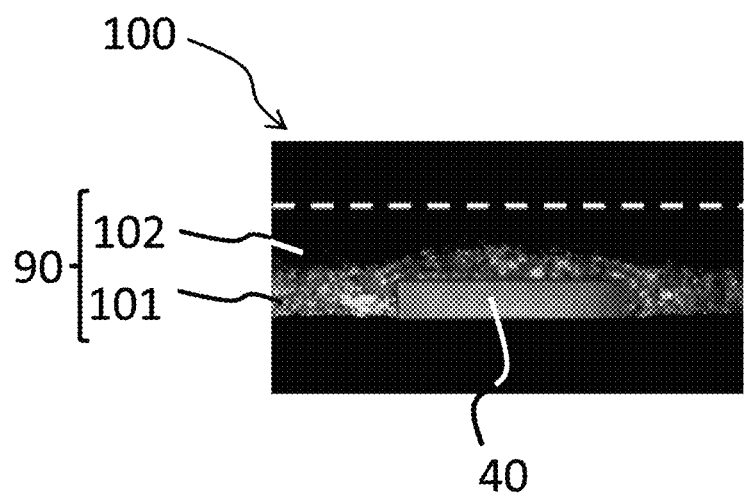
FIG. 4 is a fluorescent micrograph of an enlarged sectional view of a light emitting device according to an example embodiment.

FIG. 4 is a 20× photograph of a cross-section of the light emitting device of Example 2, which was taken by a fluorescent microscope. As shown in FIG. 4, it was confirmed that the first section 101 that contains the red-light fluorescent material 70 and the non-red-light fluorescent material 80, and that covers the light emitting element 40, and the second section 102 that is provided on the first section 101 and that contains substantially no red-light fluorescent material 70 were formed in the light emitting device 100 of Example 2. Silica nanoparticles were substantially uniformly dispersed in the first section 101, and were also substantially uniformly dispersed in the second section 102.

Comparative Example 4

Resin composition 2 was obtained in the same manner as resin composition 1 except that red-light fluorescent material 2, which differs from the red-light fluorescent material that was used in Example 1, was used in the resin composition. The red-light fluorescent material 2 has no surface region that has a lower $Mn^{4+}$ concentration than the inner region of the fluorescent material. The light emitting device of Comparative Example 4 was produced in the same manner as Example 2, except that resin composition 2 was used.

Comparative Example 5

Resin composition 5 was obtained in the same manner as resin composition 1, except that the resin composition contains no silica nanoparticles. The light emitting device of Comparative Example 5 was produced in the same manner as Example 2, except that resin composition 5 was used.

Comparative Example 6

Resin composition 6 was obtained in the same manner as resin composition 2 except that the resin composition contains no silica nanoparticles and contains a red-light fluorescent material 2, which differs from the red-light fluorescent material of Example 1. The red-light fluorescent material 2 has no surface region that has a lower $Mn^{4+}$ concentration than the inner region of the fluorescent material. The light emitting device of Comparative Example 6 was produced in the same manner as Example 2, except that the resin composition 6 was used.

Pressure Cooker Test (PCT)

The light emitting devices of Example 2 and Comparative Examples 4 to 6 underwent a PCT under the conditions of 121° C., 100% humidity, 2 atmospheric pressure (atm), and 100 hours. The results are shown in Table 4 and FIG. 5.

Table 4 shows whether the red-light fluorescent material has the above-defined surface region or not, whether the silica nanoparticles are contained or not, whether the encapsulation member has the above-defined first section and the second section, and whether discoloration after 100 hour-PCT test is observed for the light emitting devices of Example 2 and Comparative Examples 4 to 6. As for the surface region, "Yes" indicates that the red-light fluorescent material in question has a surface region with a lower tetravalent manganese ion concentration than the inner region of the fluorescent material, and "No" indicates that the red-light fluorescent material has no such a surface region. As for silica nanoparticles, "Yes" indicates that silica nanoparticles are contained in the resin composition, which constitutes the encapsulation member of the light emitting device in question, and "No" indicates that no silica nanoparticles are contained. As for the first section and the second section, "Yes" indicates that the encapsulation member of the light emitting device in question has a first section and a second section, and "No" indicates that the encapsulation member has no first and second sections.

The presence of discoloration after the PCT test was evaluated according to the following scale.

A: No discoloration
B: Slight discoloration
C: Noticeable discoloration

TABLE 4

| | Presence of the Surface region in the red-light fluorescent material | Presence of Silica nano-particles | Presence of First section and Second section | Presence of Discoloration after the PCT test |
|---|---|---|---|---|
| Example 2 | Yes | Yes | Yes | A |
| Comparative Example 4 | No | Yes | Yes | A |
| Comparative Example 5 | Yes | No | Yes | A |
| Comparative Example 6 | No | No | Yes | A |

Figure 5A:
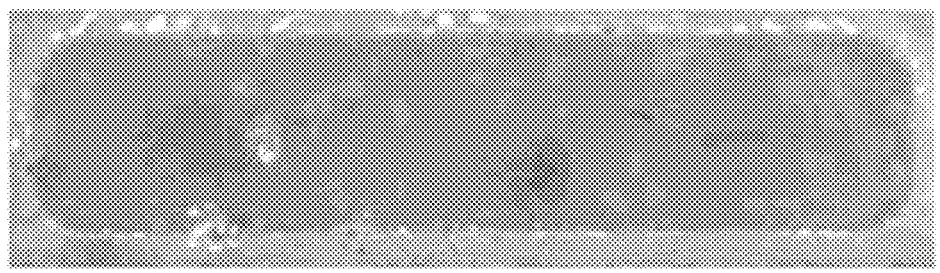
FIGS. 5A to 5D are photographs showing the results of a PCT of the light emitting devices of Example 2 and Comparative Examples 4 to 6.

FIG. 5A is a photograph of the light emitting device of Example 2, taken after 100 hours of PCT.

As shown in FIG. 5A, no discoloration was observed on the surface of the light emitting device of Example 2 even after 100 hours of PCT.

Figure 5B:
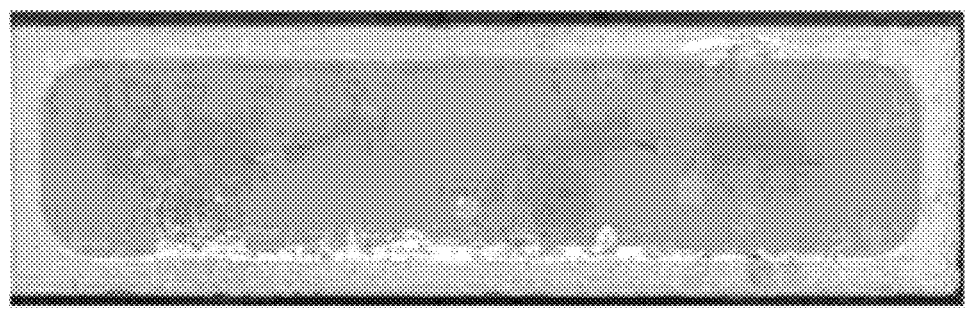

FIG. 5B is a photograph of the light emitting device of Comparative Example 4, taken after 100 hours of PCT.

Figure 5C:
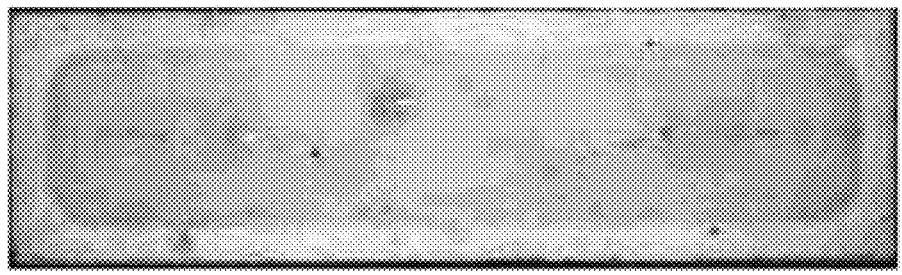

FIG. 5C is a photograph of the light emitting device of Comparative Example 5, taken after 100 hours of PCT.

Figure 5D:
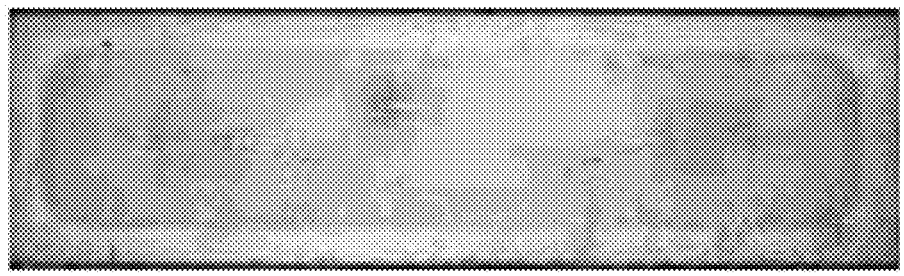

FIG. 5D is a photograph of the light emitting device of Comparative Example 6, taken after 100 hours of PCT.

As shown in FIGS. 5B to 5D, no discoloration was observed on the surfaces of the light emitting devices of Comparative Examples 4 to 6 after 100 hours of PCT.

The results confirm the following matters. In such a light emitting device (i.e., a light emitting device including an encapsulation member that is composed of a first section that contains fluorescent material particles that are settled under centrifugal force, and that covers a light emitting element, and a second section that is provided on the first section, and that contains substantially no fluorescent materials), water in the air that enters through, for example, the interface between the light emitting surface and the package is blocked by the second section and unlikely to reach the fluorescent materials, which are contained in the first section. Thus, the reaction between water and the tetravalent manganese ion that is contained in the tetravalent manganese ion ($Mn^{4+}$)-activated red-light fluorescent material, can be prevented or reduced, and discoloring of the particle surface due to the generation of manganese dioxide can be prevented or reduced. Hence, the light emitting device can demonstrate full moisture resistance in a long-term reliability test.

In such a light emitting device, water in the air is blocked by the second section, and is unlikely to reach the red-light fluorescent material, which is contained in the first section, and thus $Mn^{4+}$ and F, which are contained in the red-light fluorescent material, are prevented from eluding from the red-light fluorescent material, thereby preventing or reducing deterioration of the resin constituting the first section and the second section.

Examples 3 to 5, Comparative Examples 7 to 9, and Reference Example

The light emitting device according to Reference Example includes YAG as a fluorescent material. In Reference Example, a light emitting device was produced in the same manner as Example 2, except that YAG was used as a fluorescent material. Examples 3 to 5 used the red-light fluorescent material obtained in Production Example 1. In Examples 3 to 5, a light emitting device was produced in the same manner as Example 2, using resin compositions 7 to 9, having the same components and formulation ratio as resin composition 1, except that the fluorescent material shown in Table 5 was used as a green to yellow-light emitting fluorescent material. Comparative Examples 7 to 9 used a red-light fluorescent material ($CaAlSiN_3$:Eu, hereinafter also referred to as "CASN"), which differs from the one used in Example 1. Comparative Examples 7 to 9 used resin compositions 10 to 12 having the same components and formulation ratio as resin composition 1, except that the green to yellow-light emitting fluorescent material (β-sialon) and the red-light fluorescent material (CASN) were formulated so that the mass ratio of the green to yellow-light emitting fluorescent material to the red-light fluorescent material (β-sialon:CASN) is 90:10. In Comparative Examples 7 to 9, light emitting devices were produced in the same manner as Example 2 except that the resin compositions 10 to 12 were used. All the light emitting devices of Reference Example, Examples 3 to 5, and Comparative Examples 7 to 9 had an encapsulation member 90 composed of a first section 101 that includes fluorescent material particles and that covers light emitting elements 40, and a second section 102 that is provided on the first section 101 and that contains substantially no fluorescent materials (see FIG. 2).

NTSC Ratio

The light emitting devices of Reference Example, Examples 3 to 5, and Comparative Examples 7 to 9 were incorporated into image display apparatuses. NTSC ratios of these image display apparatuses were determined.

The NTSC ratio is the ratio of the area of a triangle defined by three chromaticity points (red, green, blue) of the display apparatus to be evaluated to the area of a triangle defined by the chromaticity points of three primary colors, red (0.670, 0.330), green (0.210, 0.710), and blue (0.140, 0.080), of the standard chromaticity (x, y) according to the CIE1931 XYZ display color system established by the National Television Standards Committee (NTSC) of the USA. The range of color reproducibility is defined by the area ratio, and a higher area ratio means higher color reproducibility.

The range of color reproducibility of the image display apparatus preferably has an NTSC ratio of 70% or higher in CIE1931 chromaticity coordinate.

sRGB

The light emitting devices of Reference Example, Examples 3 to 5, and Comparative Examples 7 to 9 were incorporated into image display apparatuses. sRGB of these image display apparatuses were determined.

sRGB ratio is the ratio of the area of a triangle defined by three chromaticity points (red, green, blue) of the display apparatus to be evaluated to the area of a triangle defined by the chromaticity points of three primary colors, red (0.6400, 0.3300), green (0.3000, 0.6000), and blue (0.1500, 0.0600), of the standard chromaticity (x, y) according to the CIE1931 XYZ display color system established by the International Electrotechnical Commission (IEC). The range of color reproducibility is defined by the area ratio, and a higher area ratio means higher color reproducibility.

Luminous Flux: Relative Flux (LED)

The luminous flux was each determined for the light emitting devices of Reference Example, Examples 3 to 5, and Comparative Examples 7 to 9, using an integrating sphere.

Table 5 shows the measurement results of the NTSC ratio, sRGB, and luminous flux of the light emitting devices (LED) of Reference Example, Examples 3 to 5, and Comparative Examples 7 to 9. The numerical values in parentheses for the fluorescent materials in Table 5 indicate the emission peak wavelength of the respective fluorescent materials.

TABLE 5

| | Fluorescent material | | | | | |
|---|---|---|---|---|---|---|
| | Green light emitting fluorescent material | Red-light fluorescent material | NTSC | sRGB (U'V' Area) | Relative Brightness (Panel) | Relative Flux (LED) |
| Reference Example | | YAG | 70% | 100% | 100 | 100 |
| Example 3 | β-sialon (540 nm) | Production Example 1 (630 nm) | 90% | 135% | 96 | 87 |
| Example 4 | β-sialon (535 nm) | Production Example 1 (630 nm) | 93% | 137% | 91 | 82 |
| Example 5 | β-sialon (531 nm) | Production Example 1 (630 nm) | 96% | 139% | 83 | 75 |
| Comparative Example 7 | β-sialon (540 nm) | CASN (660 nm) | 77% | 123% | 80 | 68 |

TABLE 5-continued

|  | Fluorescent material | | NTSC | sRGB (U'V' Area) | Relative Brightness (Panel) | Relative Flux (LED) |
|---|---|---|---|---|---|---|
|  | Green light emitting fluorescent material | Red-light fluorescent material | | | | |
| Comparative Example 8 | β-sialon (535 nm) | CASN (660 nm) | 80% | 127% | 76 | 64 |
| Comparative Example 9 | β-sialon (531 nm) | CASN (660 nm) | 83% | 130% | 70 | 58 |

As shown in Table 5, the light emitting devices of Examples 3 to 5 demonstrated numerical values superior to those of the light emitting devices of Comparative Examples 7 to 9 in all of NTSC ratio, sRGB, and luminous flux (LED). Thus, both color reproducibility and luminous flux (LED) have been improved. The light emitting devices of Comparative Examples 7 to 9 were inferior in luminous flux, showing 68, 64, and 58 relative to the luminous flux 100 of the light emitting device of Reference Example. In contrast to the light emitting devices of Comparative Examples 7 to 9, the light emitting devices of Examples 3 to 5 have improved in luminous flux, showing 87, 82, and 75.

Examples 6 to 11

As the nanoparticles, zirconia nanoparticles and/or silica nanoparticles was used. Resin compositions 13 to 18, which have the same components and formulation ratio as resin composition 1, were used, except that the nanoparticles and the fluorescent material in the resin compositions were formulated as shown in Table 6. Light emitting devices were produced in the same manner as Example 1 except that resin compositions 13 to 18 were used. The nanoparticles used in the resin compositions are as follows. Zirconia nanoparticles and/or silica nanoparticles was substantially uniformly dispersed in encapsulation member 9.

Zirconia nanoparticles (zirconium dioxide, the number average primary particle size as determined by TEM: 5 nm)

Silica nanoparticles (silica, the number average primary particle size as determined by TEM: 12 nm)

Comparative Example 10

Resin composition 19 was used, which has the same components and formulation ratio as resin composition 1, except that the resin composition contains no zirconia nanoparticles or silica nanoparticles. A light emitting device was produced in the same manner as Example 1, except that the resin composition 19 was used.

Light Lumen Maintenance Factor (%)

The resultant light emitting devices were placed in a thermostatic chamber that is set at a temperature of 85° C. and 85% humidity, and a reliability test of the light emitting devices were performed by lighting at 1 mA. The reliability for the light emitting devices was each determined by light lumen maintenance factor, which was obtained by measuring the luminous flux after lighting for 1993 hours relative to the initial luminous flux in the thermostatic chamber.

Light lumen maintenance factor (%)=(luminous flux after 1993 hours/initial luminous flux)×100

Table 6 shows the light lumen maintenance factors (%) of Examples 6 to 11 and Comparative Example 10.

TABLE 6

| | Resin (mass parts) | Zirconia nano-particle (mass parts) | Silica nano-particle (mass parts) | Fluorescent material (mass parts) | Light lumen maintenance factor (%) |
|---|---|---|---|---|---|
| Comparative Example 10 | 100 | — | — | 39 | 70.6 |
| Example 6 | | — | 0.4 | 36 | 85.9 |
| Example 7 | | 5 | — | 37 | 91.5 |
| Example 8 | | 20 | — | 36 | 91.8 |
| Example 9 | | 0.8 | 0.4 | 37 | 84.5 |
| Example 10 | | 5 | 0.4 | 34 | 94.7 |
| Example 11 | | 20 | 0.4 | 33 | 93.8 |

The light emitting devices of Examples 6 to 7, which include zirconia nanoparticles and/or a specific amount of silica nanoparticles have a larger light lumen maintenance factor than the light emitting device of Comparative Example 10. Thus, they have superior durability in a long-term reliability test. More specifically, Examples 6, 7, and 8, which include either one of zirconia nanoparticles or silica nanoparticles, exhibit a higher light lumen maintenance factor than Comparative Example 10, which includes none of these particles. As shown in Examples 10 and 11, which include both zirconia nanoparticles and silica nanoparticles each at a specific amount, exhibit a higher light lumen maintenance factor than Examples 6, 7, and 8, which include either one of zirconia nanoparticles and silica nanoparticles alone.

Examples 12 to 14

Aluminum oxide nanoparticles, titanium oxide nanoparticles, and zinc oxide nanoparticles were used, respectively, in Examples 12 to 14. Resin compositions 19 to 21, which have the same components and formulation ratio as resin composition 1, were used, except that the nanoparticles and the fluorescent materials in the resin composition were formulated as shown in Table 7. Light emitting devices were produced in the same manner as Example 1, except that the resin compositions 19 to 21 were used. The nanoparticles used in the resin composition are as follows.

Aluminum oxide nanoparticles (the number average primary particle size as determined by TEM: 31 nm)

Titanium oxide nanoparticles (the number average primary particle size as determined by TEM: 36 nm) Zinc oxide nanoparticle (the number average primary particle size as determined by TEM: 34 nm)

Light lumen maintenance factor (%)

The resultant light emitting devices were placed in a thermostatic chamber that is set to a temperature at 85° C. and at a humidity of 85%, and turned on at 1 mA, and a reliability test of the light emitting device was performed. The reliability of the light emitting devices was each determined by the light lumen maintenance factor, which was obtained by measuring the luminous flux after lighting for 352 hours relative to the initial luminous flux in the thermostatic chamber.

Light lumen maintenance factor (%)=(luminous flux after 352 hours/initial luminous flux)×100

Table 7 shows the light lumen maintenance factors (%) of Examples 12 to 14 and Comparative Example 11.

TABLE 7

|  | Resin (mass parts) | Nano-particle material | Nano-particle (mass parts) | Fluorescent material (mass parts) | Light lumen maintenance factor (%) |
|---|---|---|---|---|---|
| Comparative Example 11 | 100 | — | — | 35 | 88.9 |
| Example 12 | | Aluminum oxide | 0.8 | 35 | 93.5 |
| Example 13 | | Zinc oxide | 0.8 | 35 | 92.1 |
| Example 14 | | Titanium oxide | 0.8 | 35 | 93.2 |

The light emitting devices according to one mode of the present disclosure have successfully reduced the losses in emission output and the generation of chromaticity change, and can be advantageously used, in particular, as light sources for white illumination using a blue light emitting diode as a light source, light sources for backlights, LED displays, traffic lights, illuminated switches, various sensors and various indicators, for example, and exhibit superior durability, reliability, and light emission properties, in particular, for illumination.

As described above, it should be obvious that various other embodiments are possible without departing the spirit and scope of the present invention. Accordingly, the scope of the present invention should be limited only by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A resin composition comprising:
   a fluorescent material;
   a resin; and
   nanoparticles selected from at least one of the group consisting of aluminum oxide nanoparticles, titanium oxide nanoparticles, zinc oxide nanoparticles, zirconium oxide nanoparticles, and silicon oxide nanoparticles,
   wherein when the resin composition includes silicon oxide nanoparticles, the content of the silicon oxide nanoparticles is 0.02 to 5 mass parts relative to 100 mass parts of the resin, and
   wherein the fluorescent material is a red-light emitting fluorescent material including a fluoride material having a chemical composition that includes tetravalent manganese, at least one selected from the group consisting of alkali metal elements and NH$_4^+$, and at least one selected from the group consisting of elements from Group 4 of the periodic table and elements from Group 14 of the periodic table.

2. The resin composition according to claim 1, wherein the fluorescent material has a surface region with a lower tetravalent manganese ion concentration than the inner region of the fluorescent material.

3. The resin composition according to claim 1, wherein the fluorescent material has a chemical composition represented by the formula (I):

$$A_2[M_{1-x}Mn^{4+}_xF_6]$$

wherein A is at least one selected from the group consisting of alkali metal elements and NH$_4^+$; M is at least one selected from the group consisting of elements from Group 4 of the periodic table and elements from Group 14 of the periodic table; and x satisfies 0<x<0.2.

4. A light emitting device comprising:
   a package;
   a light emitting element disposed in the package;
   an encapsulation member that covers the light emitting element, the encapsulation member being formed from a resin composition that contains a fluorescent material, a resin, and nanoparticles selected from at least one of the group consisting of aluminum oxide nanoparticles, titanium oxide nanoparticles, zinc oxide nanoparticles, zirconium oxide nanoparticles, and silicon oxide nanoparticles,
   wherein when the resin composition includes silicon oxide nanoparticles, the content of the silicon oxide nanoparticles is 0.02 to 5 mass parts relative to 100 mass parts of the resin; and
   wherein the fluorescent material is a red-light emitting fluorescent material including fluoride material having a chemical composition that includes tetravalent manganese, at least one selected from the group consisting of alkali metal elements and NH$_4^+$, and at least one selected from the group consisting of elements from Group 4 of the periodic table and elements from Group 14 of the periodic table.

5. The light emitting device according to claim 4, wherein the fluorescent material has a surface region with a lower tetravalent manganese ion concentration than the inner region of the fluorescent material.

6. The light emitting device according to claim 4, wherein the fluorescent material has a chemical composition represented by the formula (I):

$$A_2[M_{1-x}Mn^{4+}_xF_6] \qquad (I)$$

wherein A is at least one selected from the group consisting of alkali metal elements and NH$_4^+$; M is at least one selected from the group consisting of elements from Group 4 of the periodic table and elements from Group 14 of the periodic table, and x satisfies 0<x<0.2.

7. The light emitting device according to claim 4, wherein the nanoparticles selected from at least one of the group consisting of aluminum oxide nanoparticles, titanium oxide nanoparticles, zinc oxide nanoparticles, and zirconium oxide nanoparticles are present in the resin composition in an amount of 0.1 to 30 mass parts relative to 100 mass parts of the resin.

8. The light emitting device according to claim 4, wherein the nanoparticles include zirconium oxide nanoparticles.

9. The light emitting device according to claim 4, wherein the nanoparticles include aluminum oxide nanoparticles.

10. The light emitting device according to claim 4, wherein the nanoparticles include titanium oxide nanoparticles.

11. The light emitting device according to claim 4, wherein the nanoparticles include zinc oxide nanoparticles.

12. The light emitting device according to claim 4, wherein the nanoparticles include silicon oxide nanoparticles and zirconium oxide nanoparticles.

13. The light emitting device according to claim 4, wherein the nanoparticles have a number average primary particle size of 1 nm to 100 nm.

14. The light emitting device according to claim 4, wherein M in the formula (I) is at least one element selected from the group consisting of titanium (Ti), zirconium (Zr), hafnium (Hf), silicon (Si), germanium (Ge), and tin (Sn).

15. The light emitting device according to claim 4, wherein the light emitting element has an emission peak wavelength in the range of 380 nm to 573 nm.

16. The light emitting device according to claim 4, wherein the resin contains phenyl silicone resin.

17. The light emitting device according to claim 4, wherein the encapsulation member is composed of a first section that contains the resin, the nanoparticles, and the fluorescent material and that covers the light emitting element, and a second section that is provided on the first section, and that contains the resin, the nanoparticles, and substantially no fluorescent material.

18. The light emitting device according to claim 17, wherein the nanoparticles are substantially uniformly dispersed in the first section and the second section.

19. The light emitting device according to claim 4, wherein the fluorescent material absorbs light having a maximum wavelength in the range of 380 nm to 485 nm, and further contains a green to yellow-light emitting fluorescent material having an emission peak wavelength in the range of 495 nm to 590 nm.

20. The light emitting device according to claim 19, wherein the green to yellow-light emitting fluorescent material includes at least one fluorescent material selected from the group consisting of a β-sialon having a compositional formula represented by $(Si,Al)_6(O,N)_8$:Eu, a halosilicate having a compositional formula represented by $(Ca,Sr,Ba,Zn)_8MgSi_4O_{16}(F,Cl,Br,I)_2$:Eu, an alkaline-earth thiogallate having a compositional formula represented by $(Ba,Sr,Ca)Ga_2S_4$:Eu, and a rare-earth aluminate having a compositional formula represented by $(Y,Lu)_3(Al,Ga)_5O_{12}$:Ce.

21. The light emitting device according to claim 19, wherein a mass ratio of the green to yellow-light emitting fluorescent material to the red-light fluorescent material is from 5:95 to 95:5.

* * * * *